(12) United States Patent
Abe et al.

(10) Patent No.: US 11,089,657 B2
(45) Date of Patent: *Aug. 10, 2021

(54) LIGHT-IRRADIATION HEAT TREATMENT APPARATUS

(71) Applicant: SCREEN Holdings Co., Ltd., Kyoto (JP)

(72) Inventors: Makoto Abe, Kyoto (JP); Hikaru Kawarazaki, Kyoto (JP); Hideaki Tanimura, Kyoto (JP); Masashi Furukawa, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 617 days.

This patent is subject to a terminal disclaimer.

(21) Appl. No.: 15/049,286

(22) Filed: Feb. 22, 2016

(65) Prior Publication Data

US 2016/0262207 A1  Sep. 8, 2016

(30) Foreign Application Priority Data

Mar. 6, 2015 (JP) .............................. JP2015-044631
Mar. 16, 2015 (JP) .............................. JP2015-051682
Mar. 16, 2015 (JP) .............................. JP2015-051700

(51) Int. Cl.
*H05B 3/00* (2006.01)
*F27D 11/12* (2006.01)
(Continued)

(52) U.S. Cl.
CPC ....... *H05B 3/0047* (2013.01); *F27B 17/0025* (2013.01); *F27D 11/12* (2013.01); *H01L 21/67115* (2013.01)

(58) Field of Classification Search
CPC ............... F27D 11/12; H01L 21/67115; C22C 33/0228; F16K 25/005; Y10S 75/95;
(Continued)

(56) References Cited

U.S. PATENT DOCUMENTS 4,649,261 A    3/1987  Sheets ........................... 219/390
6,426,277 B1*  7/2002  Bae ........................ H01L 21/324
                                                          257/369
(Continued)

FOREIGN PATENT DOCUMENTS

CN    101855708 A    10/2010
CN    102414800 A     4/2012
(Continued)

OTHER PUBLICATIONS

Office Action dated Mar. 28, 2018 in counterpart Chinese Patent Application No. 201610124432.2 with Japanese translation and English partial translation based on the Japanese translation.
(Continued)

*Primary Examiner* — Tu B Hoang
*Assistant Examiner* — Masahiko Muranami
(74) *Attorney, Agent, or Firm* — Ostrolenk Faber LLP

(57) ABSTRACT

A semiconductor wafer held by a holding part in a chamber is irradiated and heated with halogen light emitted from a plurality of halogen lamps. A cylindrical louver and an annular light-shielding member, both made of opaque quartz, are provided between the halogen lamps and the semiconductor wafer. The outer diameter of the light-shielding member is smaller than the inner diameter of the louver. Light emitted from the halogen lamps and passing through a clearance between the inner wall surface of the louver and the outer circumference of the light-shielding member is applied to a peripheral portion of the semiconductor wafer where a temperature drop is likely to occur. On the other hand, light travelling toward an overheat region that has a higher temperature than the other region and appears in the surface of the semiconductor wafer when only a louver is installed is blocked off by the light-shielding member.

3 Claims, 20 Drawing Sheets

(51) Int. Cl.
*F27B 17/00* (2006.01)
*H01L 21/67* (2006.01)

(58) Field of Classification Search
CPC ..... C23C 16/00; C23C 16/481; H05B 3/0047; F27B 17/0025; C30B 25/105; C30B 31/12; F02B 1/04; A21B 2/00; F26B 3/30
USPC ....... 392/411, 419, 420, 421, 422, 423, 424, 392/425, 426, 427; 118/724, 725; 219/411, 416
See application file for complete search history.

(56) References Cited

U.S. PATENT DOCUMENTS

| | | | |
|---|---|---|---|
| 6,537,927 B1* | 3/2003 | Son | H01L 21/67115 250/492.22 |
| 2003/0183612 A1 | 10/2003 | Timans et al. | 219/390 |
| 2004/0013419 A1* | 1/2004 | Sakuma | H01L 21/68792 392/411 |
| 2004/0018751 A1* | 1/2004 | Kusuda | H01L 21/26 438/795 |
| 2004/0169032 A1* | 9/2004 | Murayama | F27B 17/0025 219/411 |
| 2009/0245761 A1* | 10/2009 | Nakajima | F27B 17/0025 392/416 |
| 2011/0034015 A1 | 2/2011 | Yoshino et al. | |
| 2012/0145697 A1 | 6/2012 | Komatsu et al. | |
| 2013/0078822 A1* | 3/2013 | Yokouchi | H01L 21/67115 438/795 |
| 2014/0169772 A1 | 6/2014 | Abe et al. | |
| 2014/0319120 A1* | 10/2014 | Brillhart | H01L 21/67115 219/405 |

FOREIGN PATENT DOCUMENTS

| | | |
|---|---|---|
| JP | 60-258928 | 12/1985 |
| JP | S63-227014 A | 9/1988 |
| JP | H03-116828 A | 5/1991 |
| JP | H3-291940 A | 12/1991 |
| JP | H8-064544 A | 3/1996 |
| JP | 2000-068222 A | 3/2000 |
| JP | 2000-138170 A | 5/2000 |
| JP | 2002-217110 A | 8/2002 |
| JP | 2005-527972 | 9/2005 |
| JP | 2007-335604 A | 12/2007 |
| JP | 2009-123807 A | 6/2009 |
| JP | 2009-272399 A | 11/2009 |
| JP | 2010-135508 A | 6/2010 |
| JP | 2011-040544 A | 2/2011 |
| JP | 2012-174879 | 9/2012 |
| JP | 2014-120509 A | 6/2014 |
| TW | 200949950 A1 | 12/2009 |

OTHER PUBLICATIONS

Taiwan Office Action for Taiwan Application No. 105106577 dated Nov. 29, 2017 with English partial translation of the Office Action based on Japanese translation.
Taiwan Office Action for Taiwan Application No. 105106577 dated May 31, 2017 and its partial English translation based on the Japanese translation.
Japanese Office Action dated Aug. 21, 2018 in counterpart Japanese Application No. 2015-051682 and partial English translation thereof.
Japanese Office Action dated Aug. 28, 2018 in counterpart Japanese Application No. 2015-044631 and partial English translation thereof.
Office Action dated Aug. 21, 2018 in counterpart Japanese Patent Application No. 2015-051700.
Office Action dated Dec. 13, 2018 in counterpart Chinese Patent Application No. 201610124432.2 with Japanese translation and English partial translation based on the Japanese translation.

* cited by examiner

F I G. 2
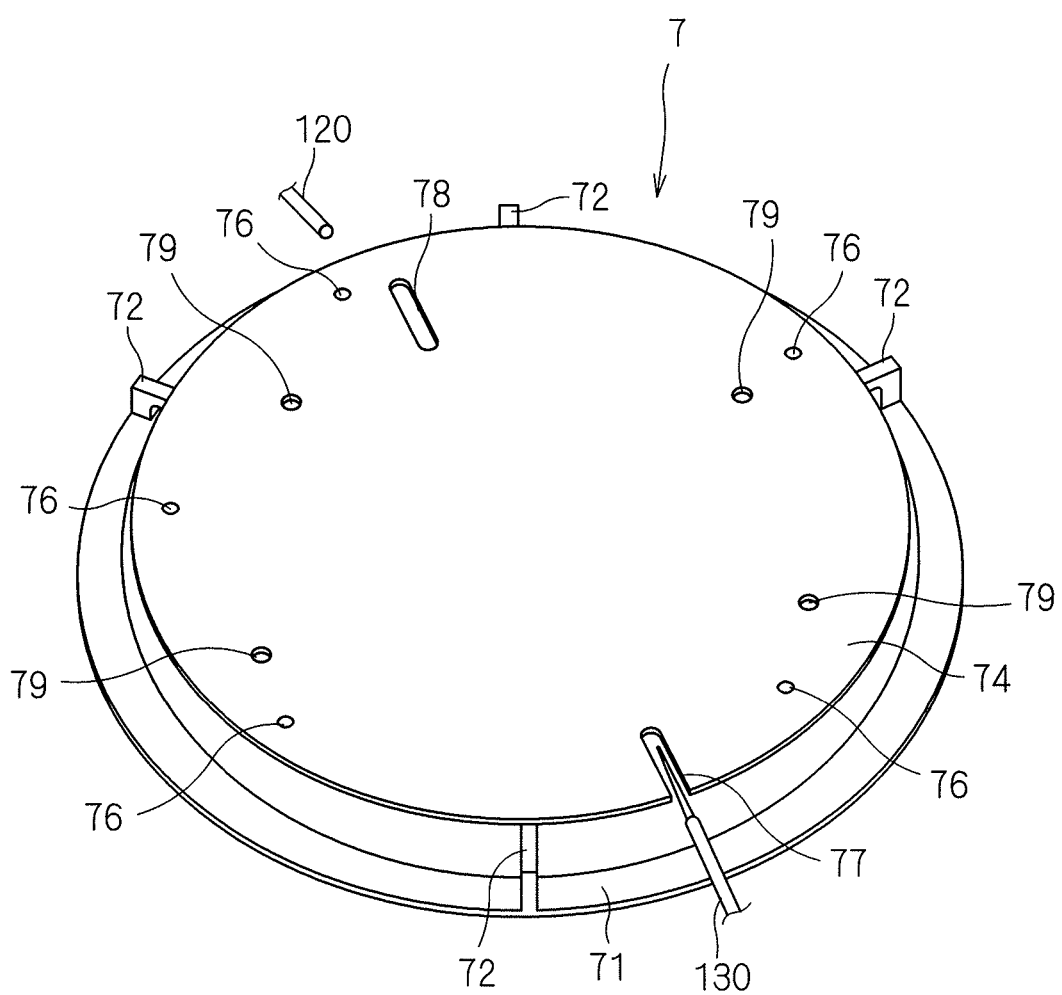

F I G. 4
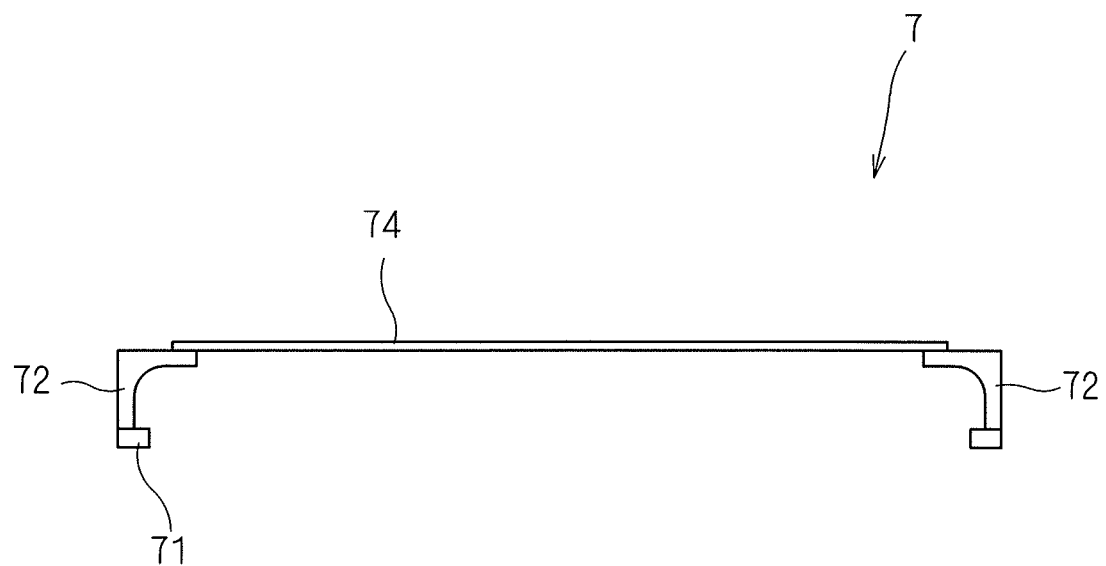

F I G. 6
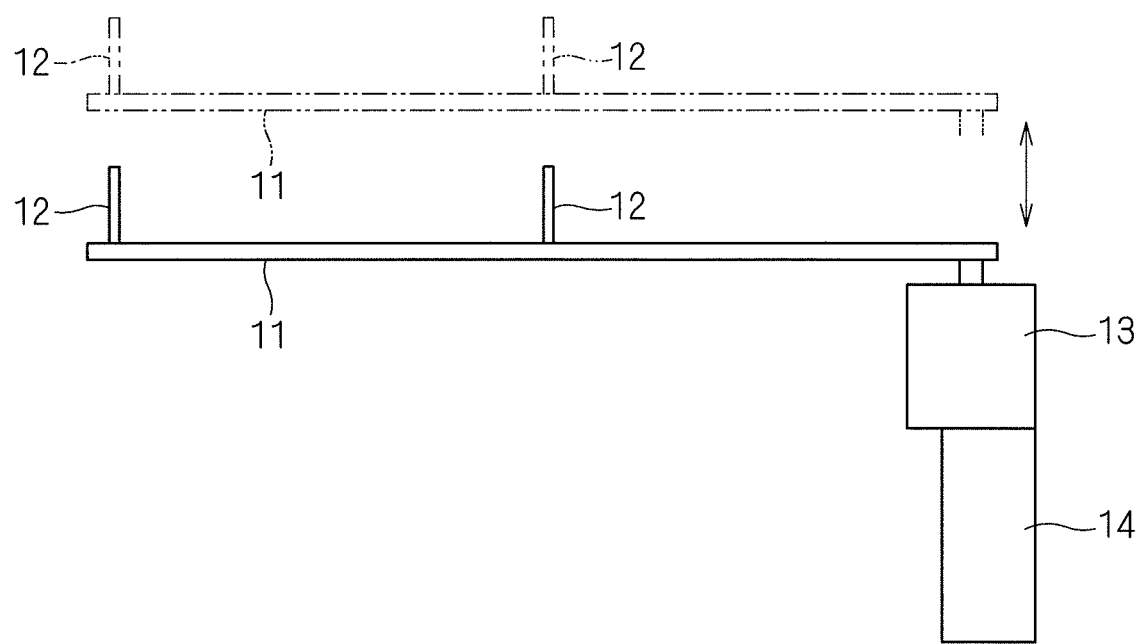

F I G. 8
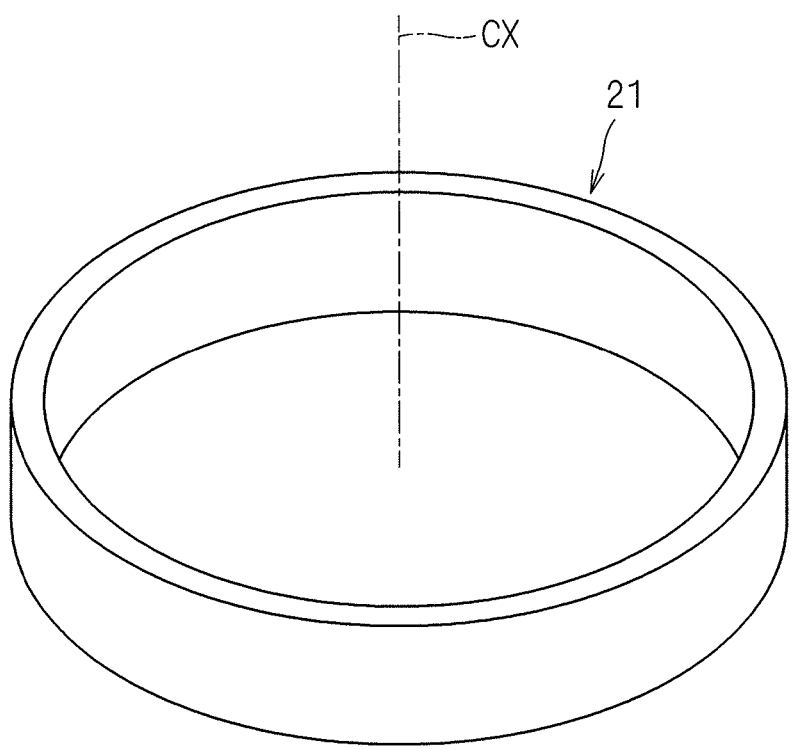

F I G. 9
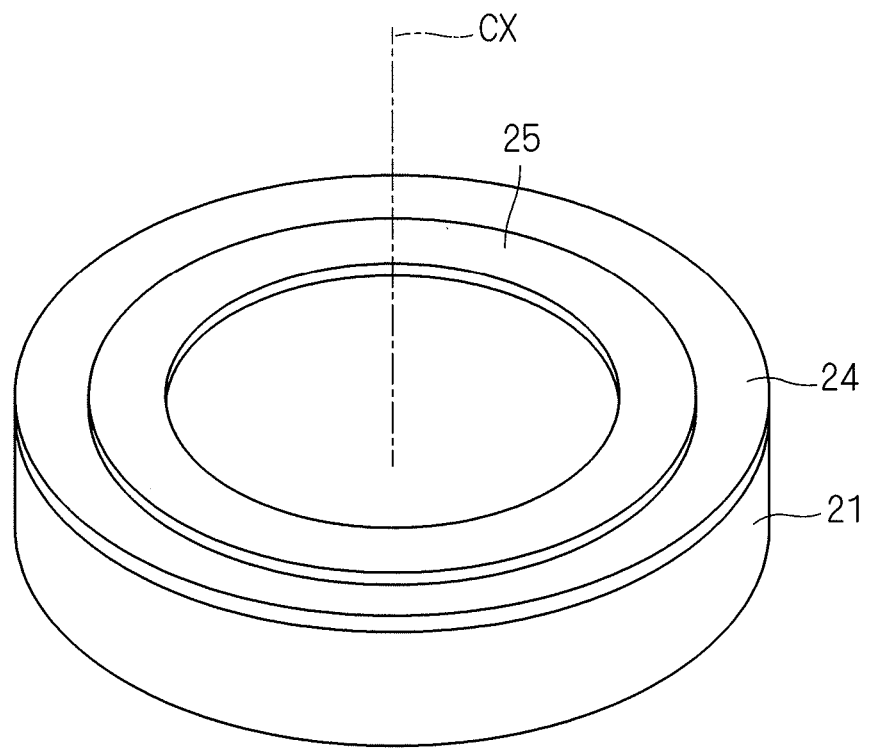

F I G . 1 2
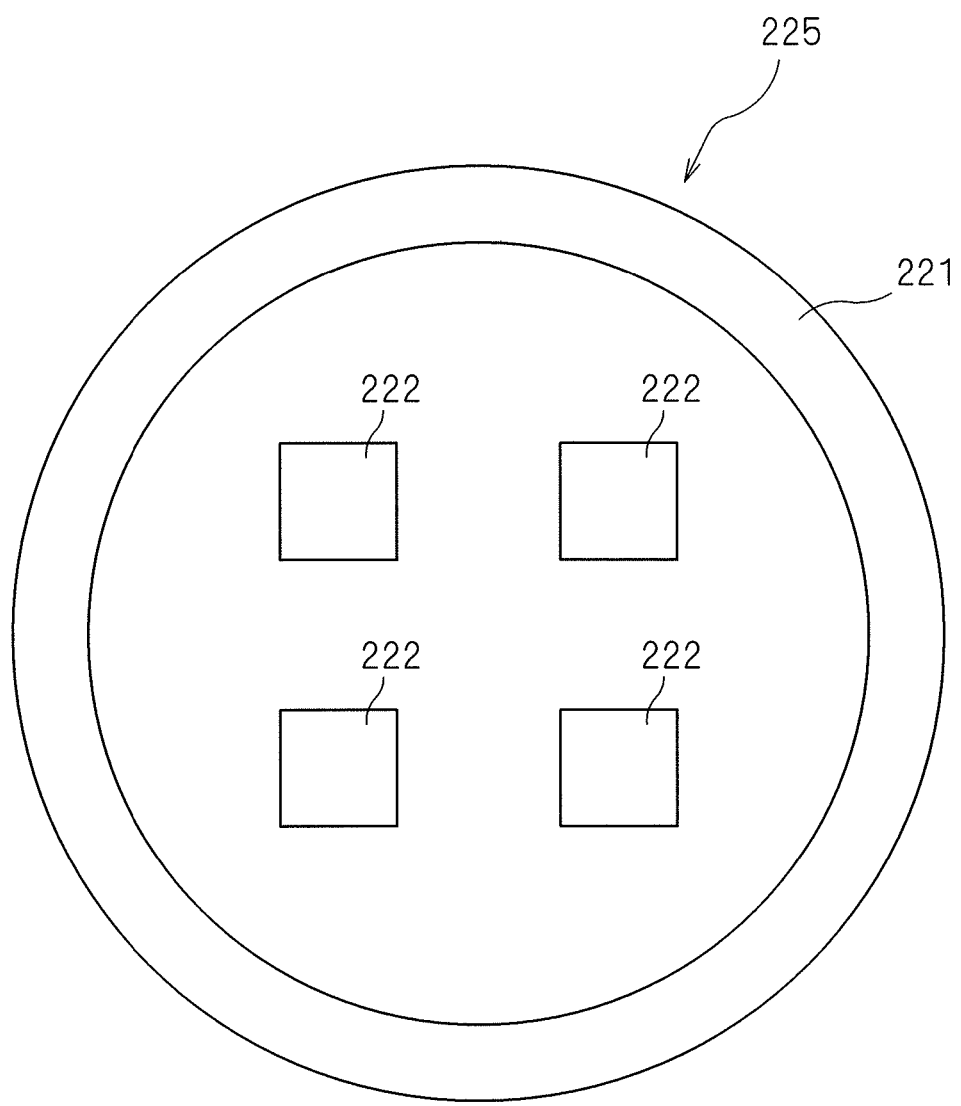

F I G . 1 4
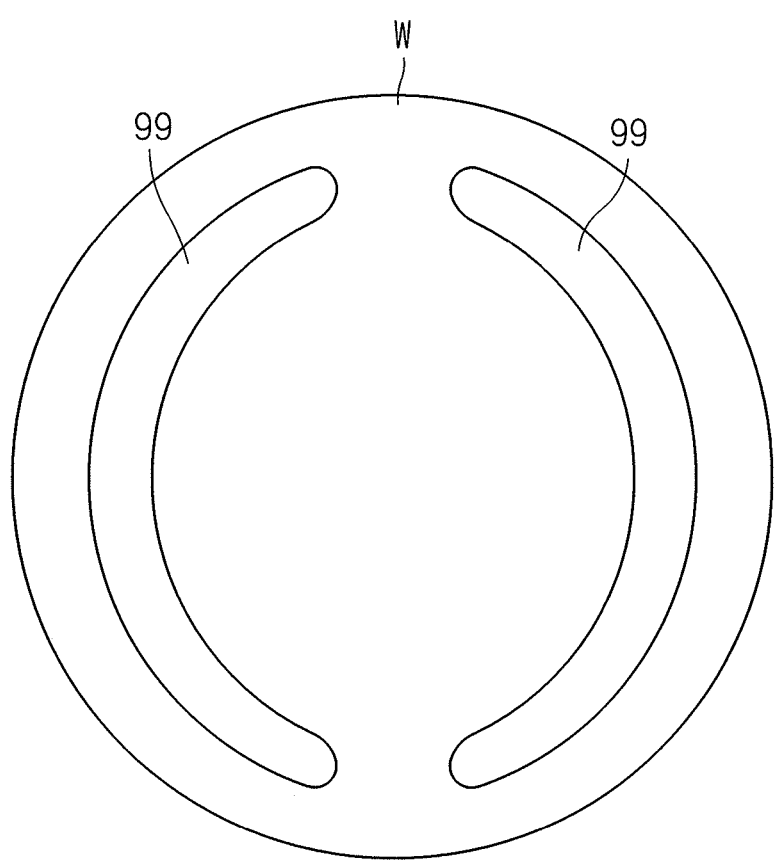

F I G . 1 5
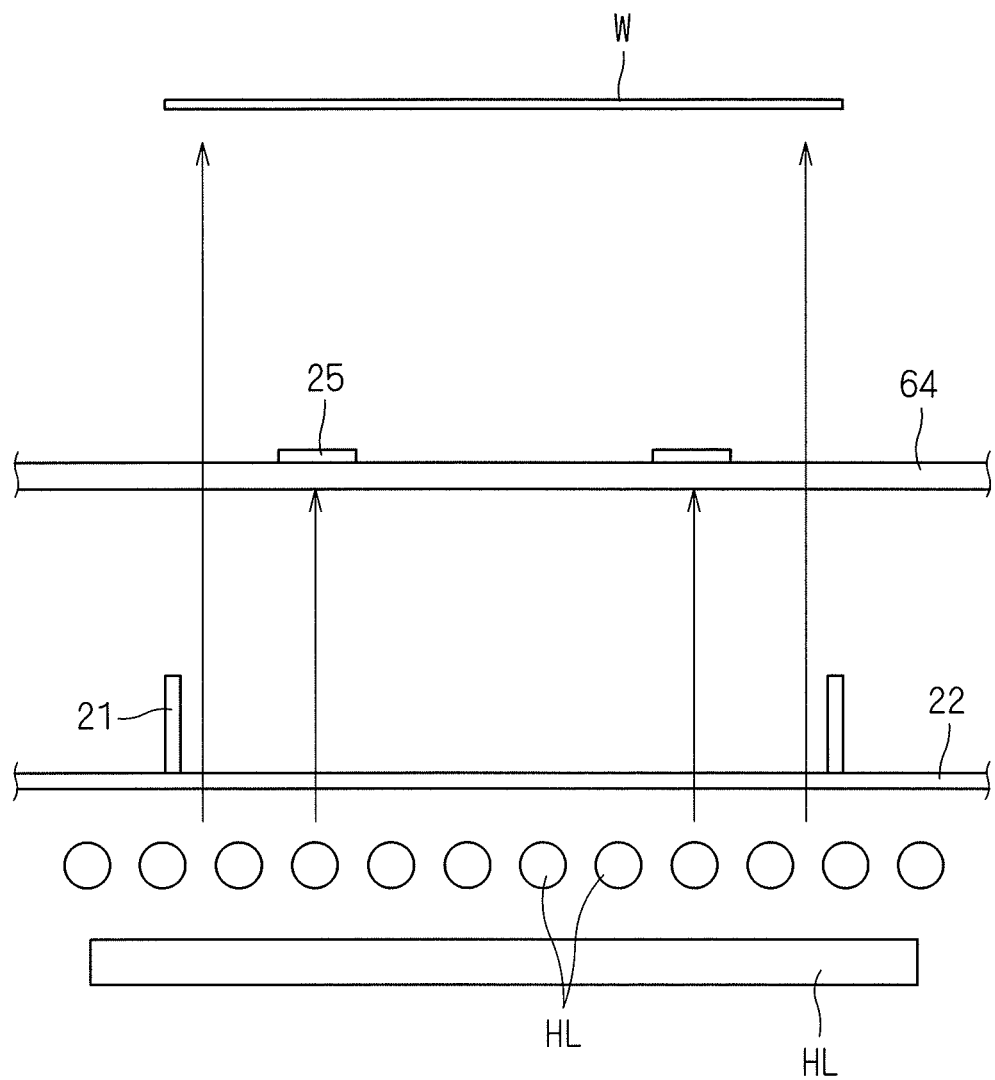

F I G . 1 7
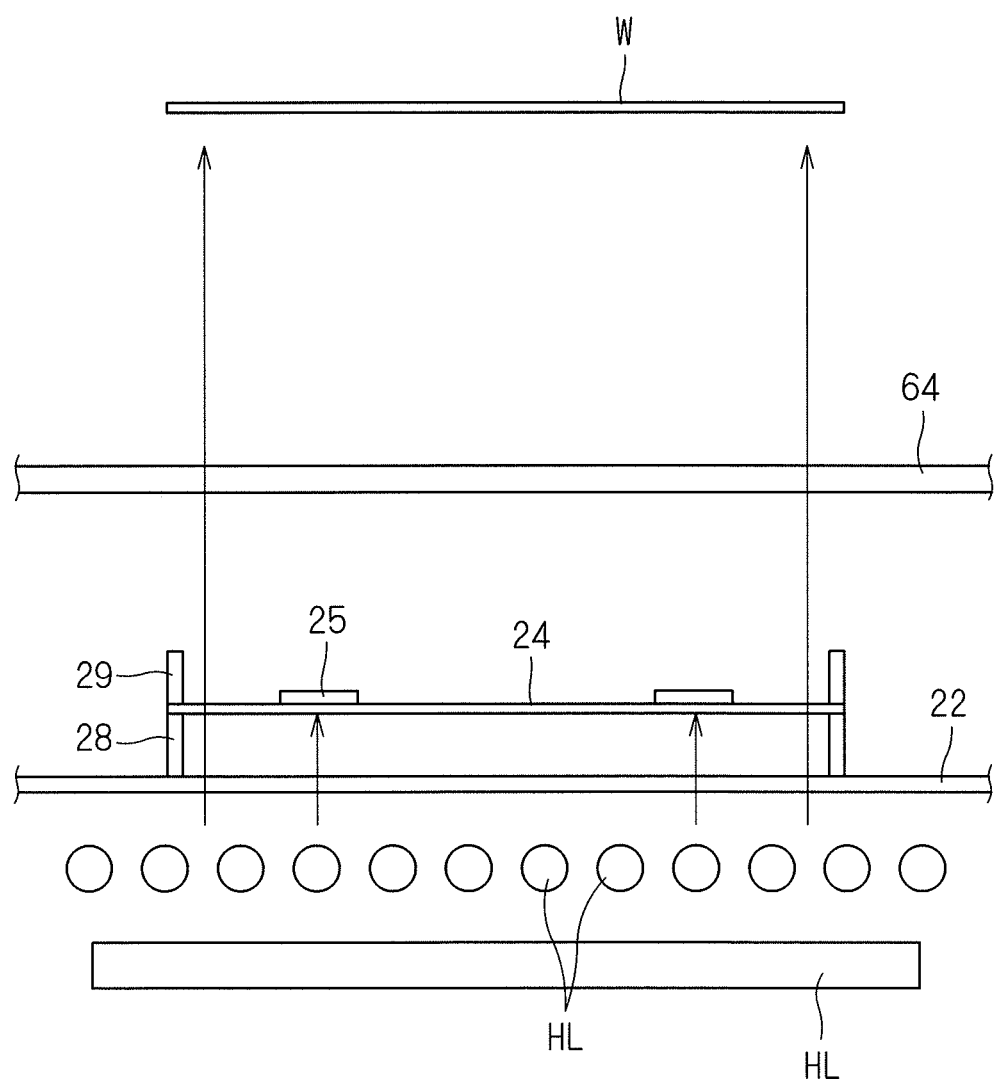

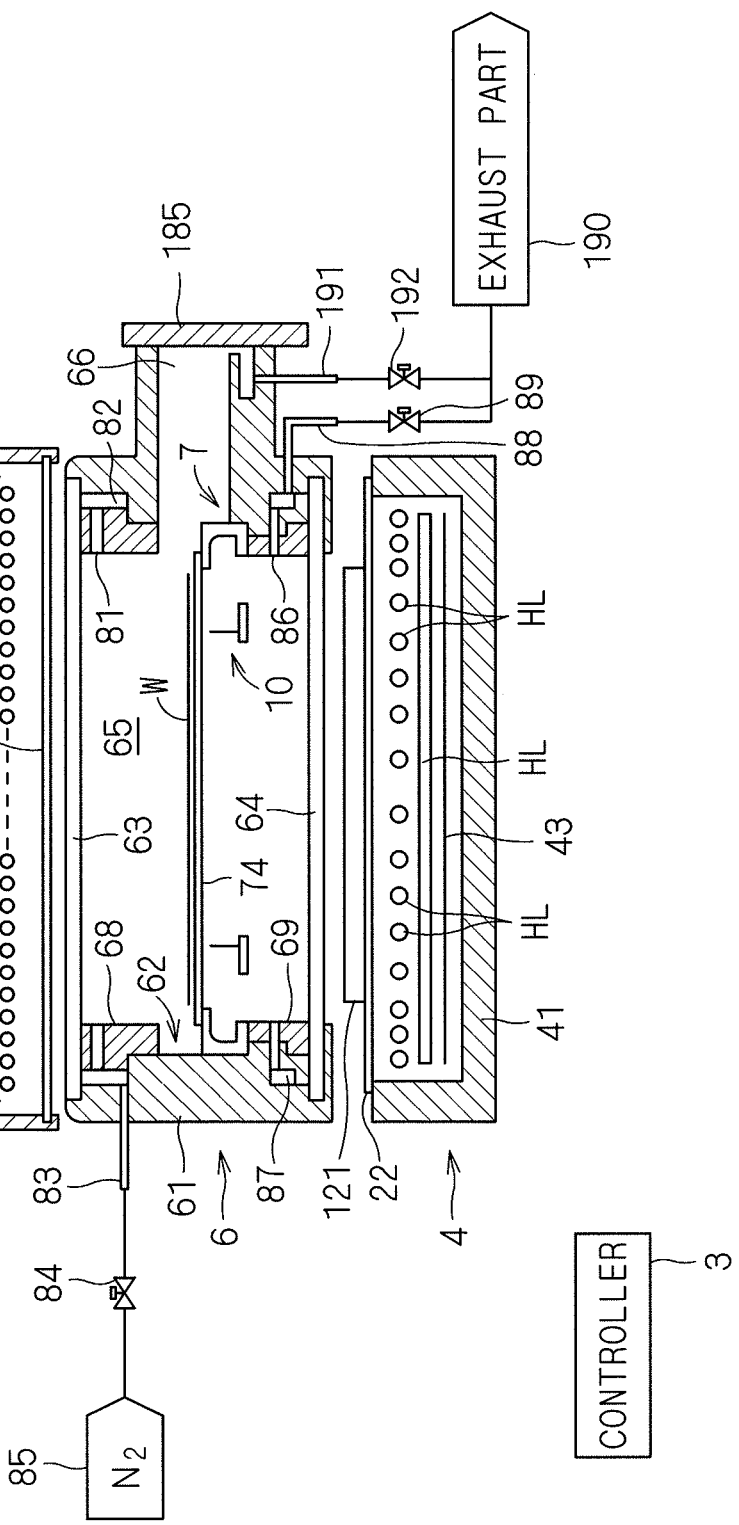
F I G . 1 8

F I G. 1 9
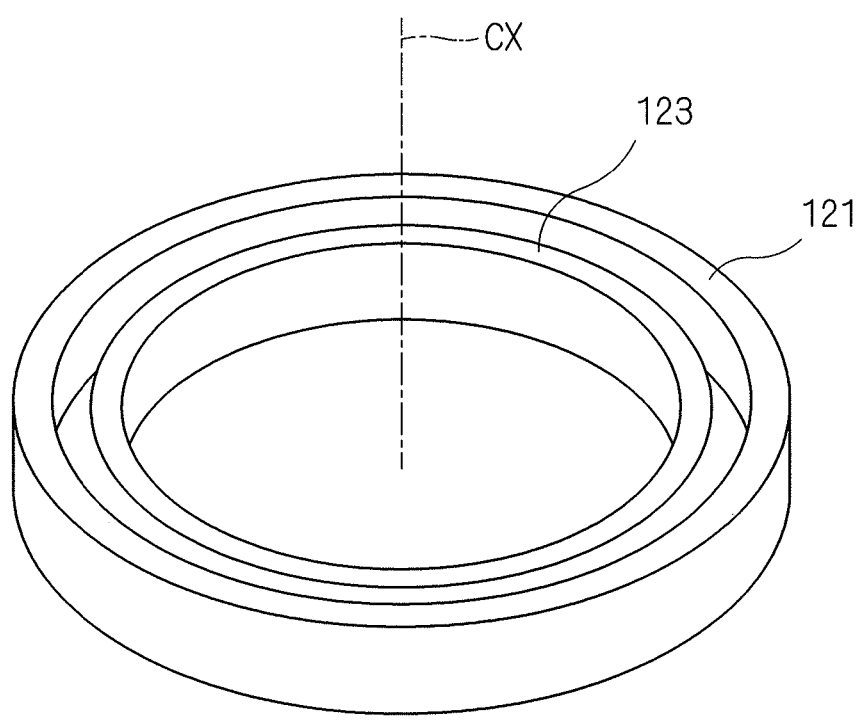

LIGHT-IRRADIATION HEAT TREATMENT APPARATUS

BACKGROUND OF THE INVENTION

1. Field of the Invention

The present invention relates to a heat treatment apparatus for heating a sheet precision electronic substrate (hereinafter, simply referred to as a "substrate") such as a disk-shaped semiconductor wafer by irradiating the substrate with light.

2. Description of the Background Art

In the process of manufacturing a semiconductor device, the introduction of impurities is an essential step for forming pn junctions in a semiconductor wafer. At present, it is common to introduce impurities by ion implantation and subsequent annealing. Ion implantation is a technique for physically doping impurities by causing impurity elements such as boron (B), arsenic (As), or phosphorus (P) to be ionized and collide with a semiconductor wafer with a high acceleration voltage. The doped impurities are activated by annealing. At this time, if the annealing time becomes about several seconds or longer, the doped impurities are deeply diffused by heat, and as a result, the junction depth may become too deeper than required and hinder the formation of a good device.

In view of this, flash-lamp annealing (FLA) is recently receiving attention as an annealing technique that allows semiconductor wafers to be heated in an extremely short time. Flash-lamp annealing is a heat treatment technique using xenon flash lamps (hereinafter, flash lamps simply referred to indicate xenon flash lamps) to irradiate the surface of a semiconductor wafer with flash light so that the temperature of only the surface of the semiconductor wafer that is doped with impurities is raised in an extremely short time (several milliseconds or less).

The radiation spectral distribution of xenon flash lamps ranges from ultraviolet to near-infrared regions, with the xenon flash lamps having shorter wavelengths than conventional halogen lamps, and approximately coincides with the fundamental absorption band of silicon semiconductor wafers. Thus, in the case where flash light is applied from xenon flash lamps to a semiconductor wafer, less light will be transmitted through the semiconductor wafer and therefore it is possible to quickly raise the temperature of the semiconductor wafer. It has also been found that the temperature of only the vicinity of the surface of the semiconductor wafer will selectively be raised with extremely short-time application of flash light for several milliseconds or less. Thus, extremely short-time temperature rise with the xenon flash lamps enables the impurities to be activated simply without being diffused deeply.

As examples of such a heat treatment apparatus using xenon flash lamps, U.S. Pat. No. 4,649,261 and U.S. 2003/0183612 A1 disclose heat treatment apparatuses that achieve desirable heat treatment with a combination of pulsed light-emitting lamps such as flash lamps that are arranged on the front side of a semiconductor wafer and continuous lighting lamps such as halogen lamps that are arranged on the rear side of the semiconductor wafer. In the heat treatment apparatuses disclosed in U.S. Pat. No. 4,649,261 and U.S. 2003/0183612 A1, a semiconductor wafer is preheated to a certain degree of temperature with, for example, halogen lamps, and then the temperature of the semiconductor wafer is raised to a desired treatment temperature by pulse heating with flash lamps.

Preheating with the halogen lamps, as disclosed in U.S. Pat. No. 4,649,261 and U.S. 2003/0183612 A1, has a processing advantage that the temperature of a semiconductor wafer will be raised to a relatively high preheating temperature in a short time, but at the same time, may cause the temperature of the peripheral portion of the wafer to be lower than the temperature of the central portion of the wafer. Conceivable causes of such an uneven temperature distribution include heat radiation from the peripheral portion of the semiconductor wafer and heat conduction from the peripheral portion of the semiconductor wafer to a relatively low-temperature quartz susceptor. To solve this problem, Japanese Patent Application Laid-Open No. 2012-174879 proposes installation of a cylindrical louver made of a semitransparent material between halogen lamps and a semiconductor wafer to make uniform the temperature distribution in the surface of the wafer during preheating.

Although the installation of the louver as proposed in Japanese Patent Application Laid-Open No. 2012-174879 certainly ameliorates the problem of a temperature drop in the peripheral portion of the semiconductor wafer, there is still a tendency for the temperature of the peripheral portion of the semiconductor wafer to be lower than the temperature of the central portion, and uniformity in the temperature distribution in the surface has not reached a sufficient level. In addition, it has been newly found out that the installation of the louver as proposed in Japanese Patent Application Laid-Open No. 2012-174879 may, on the contrary, increase the temperature of a region that is located slightly inward of the peripheral portion of the semiconductor wafer.

SUMMARY OF THE INVENTION

The present invention is directed to a heat treatment apparatus for heating a disk-shaped substrate by irradiating the substrate with light.

In one aspect of the present invention, the heat treatment apparatus includes a chamber that houses a substrate, a holding part that holds a substrate in the chamber, a light irradiation part in which a plurality of rod-shaped lamps are arranged in a light source region that is greater than a major surface of the substrate held by the holding part and that opposes the major surface, a cylindrical louver that is provided between the light irradiation part and the holding part, with a central axis of the louver passing through a center of the substrate, and that is impervious to the light emitted from the light irradiation part, and a light-shielding member that is provided between the light irradiation part and the holding part and that is impervious to the light emitted from the light irradiation part.

The heat treatment apparatus that includes the opaque cylindrical louver and the opaque light-shielding member allows part of the light travelling from the light irradiation part toward the substrate to be blocked off by the louver and the light-shielding member and thereby allows the temperature distribution in the surface of the substrate to be uniform.

In another aspect the present invention, the heat treatment apparatus includes a chamber that houses a substrate, a holding part that holds a substrate in the chamber, a light irradiation part in which a plurality of rod-shaped lamps are arranged in a region that is greater than a major surface of the substrate held by the holding part and that opposes the major surface, a cylindrical first light-shielding member that is provided between the light irradiation part and the holding part, with a central axis of the first light-shielding member passing through a center of the substrate, and that is impervious to the light emitted from the light irradiation part, and a flat-plate annular second light-shielding member that is provided between the light irradiation part and the holding part, with a central axis of the second light-shielding member passing through the center of the substrate, and that is impervious to the light emitted from the light irradiation part, the second light-shielding member having outer dimensions smaller than inner dimensions of the first light-shielding member.

The heat treatment apparatus that includes the opaque cylindrical first light-shielding member and the opaque flat-plate annular second light-shielding member, with the outer dimensions of the second light-shielding member being smaller than the inner dimensions of the first light-shielding member, allows part of the light travelling from the light irradiation part toward the substrate to be blocked off by the first light-shielding member and the second light-shielding member and thereby allows the temperature distribution in the surface of the substrate to be uniform.

In another aspect of the present invention, the heat treatment apparatus includes a chamber that houses a substrate, a holding part that holds a substrate in the chamber, a light irradiation part in which a plurality of rod-shaped lamps are arranged in a region that is greater than a major surface of the substrate held by the holding part and that opposes the major surface, a cylindrical first louver that is provided between the light irradiation part and the holding part, with a central axis of the first louver passing through a center of the substrate, and that is impervious to the light emitted from the light irradiation part, and a cylindrical second louver that is provided between the light irradiation part and the holding part, with a central axis of the second louver passing through the center of the substrate, and that is impervious to the light emitted from the light irradiation part. The first louver and the second louver have the same height, the first louver has an inner diameter greater than an outer diameter of the second louver, and the second louver is located inward of the first louver.

Since the opaque cylindrical second louver is located inward of the opaque cylindrical first louver, a cylindrical clearance is created between the first louver and the second louver. This configuration increases directivity of the light emitted from the light irradiation part and entering the clearance and thereby allows the temperature distribution in the surface of the substrate to be uniform.

Preferably, the first louver and the second louver are located with a clearance between an inner wall surface of the first louver and an outer wall surface of the second louver, the clearance opposing a peripheral portion of the substrate.

This configuration increases directivity of the light travelling toward the peripheral portion of the substrate where a temperature drop is likely to occur, and thereby allows the temperature distribution in the surface of the substrate to be uniform.

In another aspect of the present invention, the heat treatment apparatus includes a chamber that houses a substrate, a holding part that holds a substrate in the chamber, a light irradiation part in which a plurality of rod-shaped lamps are arranged in a region that is greater than a major surface of the substrate held by the holding part and that opposes the major surface, and a plurality of cylindrical louvers that are located between the light irradiation part and the holding part, with central axes of the louvers passing through a center of the substrate, and that is impervious to the light emitted from the light irradiation part, the plurality of louvers having the same height and being sequentially arranged from outside to inside in descending order of outer diameters of the plurality of louvers.

Since the plurality of opaque cylindrical louvers are sequentially located from outside to inside in descending order of their outer diameters, cylindrical clearances are created between the louvers. This configuration increases directivity of the light emitted from the light irradiation part and entering the clearances and thereby allows the temperature distribution in the surface of the substrate to be uniform.

Thus, it is an object of the present invention to make uniform the temperature distribution in the surface of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view illustrating the entire external appearance of a holding part;

FIG. 4 is a side view of the holding part as viewed from one side;

FIG. 6 is a side view of the transfer mechanism;

FIG. 8 is a perspective view of a louver;

FIG. 9 is a perspective view illustrating the entire external appearances of the louver and a light-shielding member according to the first preferred embodiment;

FIG. 12 is a plan view of a light-shielding member according to a third preferred embodiment;

FIG. 14 illustrates the temperature distribution in the surface of a semiconductor wafer in the case where only the louver is installed;

FIG. 15 illustrates the layout of a louver and a light-shielding member according to a fifth preferred embodiment;

FIG. 17 illustrates the layout of a louver and a light-shielding member according to a seventh preferred embodiment;

FIG. 18 is a longitudinal cross-sectional view of a configuration of a heat treatment apparatus according to an eighth preferred embodiment;

FIG. 19 is a perspective view of an outer louver and an inner louver; and

DESCRIPTION OF THE PREFERRED EMBODIMENTS

Hereinafter, preferred embodiments of the present invention will be described in detail with reference to the drawings.

First Preferred Embodiment

Figure 1:
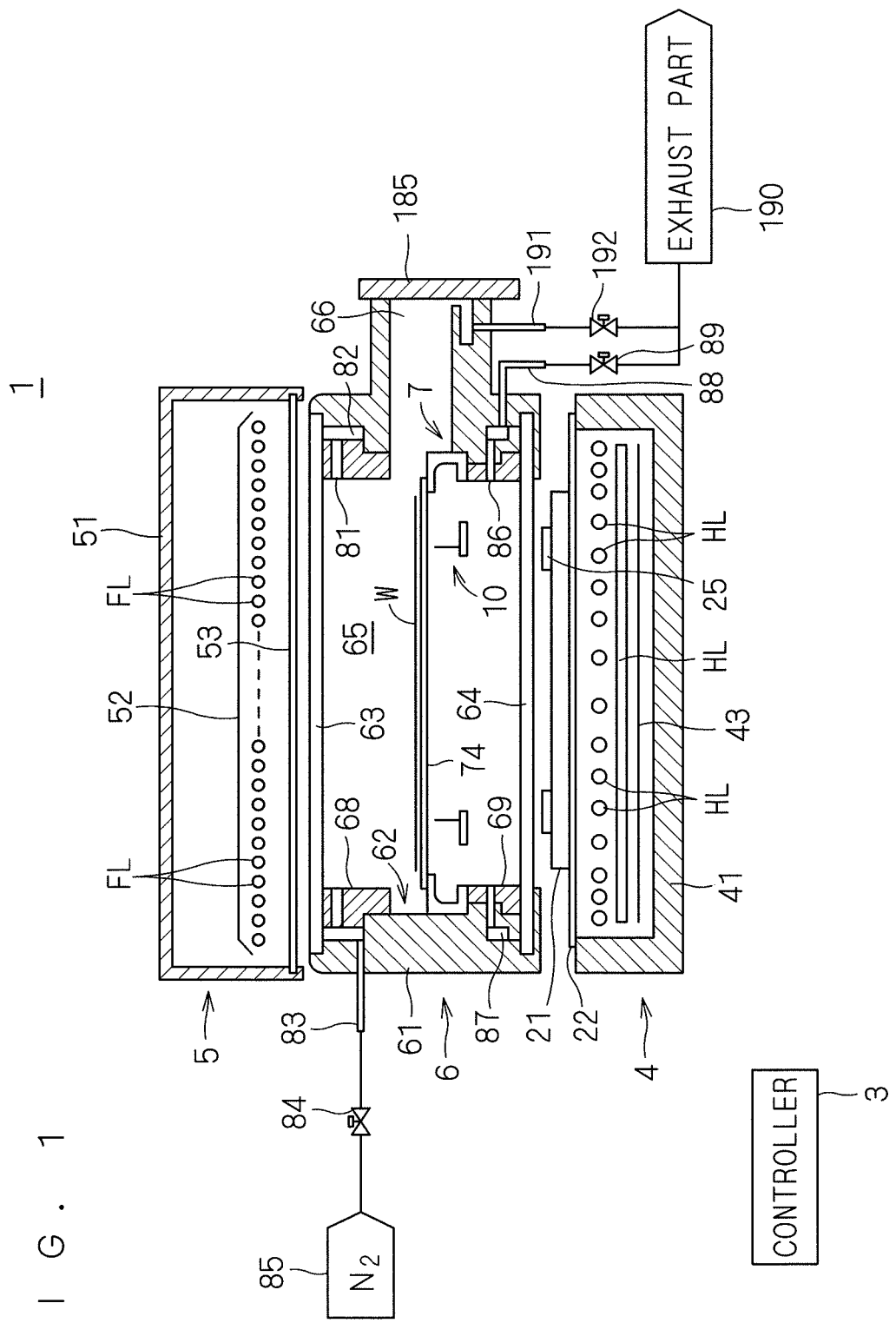
FIG. 1 is a longitudinal cross-sectional view of a configuration of a heat treatment apparatus according to the present invention.

FIG. 1 is a longitudinal cross-sectional view of a configuration of a heat treatment apparatus 1 according to the present invention. The heat treatment apparatus 1 of the present preferred embodiment is a flash-lamp annealing apparatus for heating a disk-shaped semiconductor wafer W having a diameter of 300 mm as a substrate by irradiating the semiconductor wafer W with flash light. The semiconductor wafer W is doped with impurities before being transported into the heat treatment apparatus 1, and the doped impurities are activated through heat treatment by the heat treatment apparatus 1. For easy understanding of drawings, the dimensions and number of each constituent element may be exaggerated or simplified as necessary in FIG. 1 and subsequent drawings.

The heat treatment apparatus 1 includes a chamber 6 that houses the semiconductor wafer W, a flash heating part 5 with a plurality of built-in flash lamps FL, and a halogen heating part 4 with a plurality of built-in halogen lamps HL. The flash heating part 5 is located above the chamber 6, and the halogen heating part 4 is located below the chamber 6. Also, a louver 21 and a light-shielding member 25 are located between the halogen heating part 4 and the chamber 6. The heat treatment apparatus 1 further includes, within the chamber 6, a holding part 7 that holds the semiconductor wafer W in a horizontal position and a transfer mechanism 10 for transferring the semiconductor wafer W between the holding part 7 and the outside of the heat treatment apparatus 1. The heat treatment apparatus 1 further includes a controller 3 that controls operating mechanisms located in the halogen heating part 4, the flash heating part 5, and the chamber 6 for heat treatment of the semiconductor wafer W.

The chamber 6 is configured by mounting quartz chamber windows on the top and bottom of a tubular chamber side portion 61. The chamber side portion 61 has a generally tubular shape with upper and lower openings, the upper opening being equipped with and closed by an upper chamber window 63, and the lower opening being equipped with and closed by a lower chamber window 64. The upper chamber window 63, which forms the ceiling of the chamber 6, is a disk-shaped member made of quartz and functions as a quartz window that allows the flash light emitted from the flash heating part 5 to be transmitted into the chamber 6. The lower chamber window 64, which forms the floor of the chamber 6, is also a disk-shaped member made of quartz and functions as a quartz window that allows the light emitted from the halogen heating part 4 to be transmitted into the chamber 6.

Also, a reflection ring 68 is mounted on the upper portion of the inner wall surface of the chamber side portion 61, and a reflection ring 69 is mounted on the lower portion thereof. The reflection rings 68 and 69 both have an annular shape. The upper reflection ring 68 is mounted by being fitted into the chamber side portion 61 from above. On the other hand, the lower reflection ring 69 is mounted by being fitted into the chamber side portion 61 from below and fastened with screws (not shown). That is, the reflection rings 68 and 69 are both removably mounted on the chamber side portion 61. The inner space of the chamber 6, i.e., the space surrounded by the upper chamber window 63, the lower chamber window 64, the chamber side portion 61, and the reflection rings 68 and 69, is defined as a heat treatment space 65.

The reflection rings 68 and 69 mounted on the chamber side portion 61 form a recessed portion 62 in the inner wall surface of the chamber 6. That is, the recessed portion 62 is surrounded by the central portion of the inner wall surface of the chamber side portion 61 on which the reflection rings 68 and 69 are not mounted, the lower end surface of the reflection ring 68, and the upper end surface of the reflection ring 69. The recessed portion 62 is horizontally formed in an annular shape in the inner wall surface of the chamber 6 and surrounds the holding part 7 that holds the semiconductor wafer W.

The chamber side portion 61 and the reflection rings 68 and 69 are made of a metal material (e.g., stainless steel) having excellent strength and excellent heat resistance. The inner circumferential surfaces of the reflection rings 68 and 69 are mirror-finished by electrolytic nickel plating.

The chamber side portion 61 has a transport opening (throat) 66 through which the semiconductor wafer W is transported into and out of the chamber 6. The transport opening 66 is openable and closable with a gate valve 185. The transport opening 66 is communicatively connected to the outer circumferential surface of the recessed portion 62. When opened by the gate valve 185, the transport opening 66 allows the semiconductor wafer W to be transported into and out of the heat treatment space 65 from the transport opening 66 through the recessed portion 62. When the transport opening 66 is closed by the gate valve 185, the heat treatment space 65 in the chamber 6 becomes an enclosed space.

The upper portion of the inner wall of the chamber 6 has a gas supply port 81 through which a treatment gas (in the present preferred embodiment, a nitrogen gas ($N_2$)) is supplied into the heat treatment space 65. The gas supply port 81 is located at a position above the recessed portion 62 and may be located in the reflection ring 68. The gas supply port 81 is communicatively connected to a gas supply pipe 83 via a buffer space 82 that is formed in an annular shape inside the side wall of the chamber 6. The gas supply pipe 83 is connected to a nitrogen-gas supply source 85. Also, a valve 84 is interposed in the path of the gas supply pipe 83. When the valve 84 is open, a nitrogen gas is supplied from the gas supply source 85 into the buffer space 82. The nitrogen gas flowing into the buffer space 82 flows throughout the buffer space 82 that has lower fluid resistance than the gas supply port 81, and is supplied through the gas supply port 81 into the heat treatment space 65.

On the other hand, the lower portion of the inner wall of the chamber 6 has a gas exhaust port 86 through which the gas in the heat treatment space 65 is exhausted. The gas exhaust port 86 is located at a position below the recessed portion 62 and may be located in the reflection ring 69. The gas exhaust port 86 is communicatively connected to a gas exhaust pipe 88 via a buffer space 87 that is formed in an annular shape inside the side wall of the chamber 6. The gas exhaust pipe 88 is connected to an exhaust part 190. Also, a valve 89 is interposed in the path of the gas exhaust pipe 88. When the valve 89 is open, the gas in the heat treatment space 65 is exhausted from the gas exhaust port 86 through the buffer space 87 into the gas exhaust pipe 88. A configuration is also possible in which a plurality of gas supply ports 81 and a plurality of gas exhaust ports 86 are provided in the circumferential direction of the chamber 6, or a configuration is possible in which the gas supply port 81 and the gas exhaust port 86 are slit-shaped. The gas supply source 85 and the exhaust part 190 may be mechanisms provided in the heat treatment apparatus 1, or may be utilities in a factory where the heat treatment apparatus 1 is installed.

One end of the transport opening 66 is also connected to a gas exhaust pipe 191 through which the gas in the heat treatment space 65 is exhausted. The gas exhaust pipe 191 is connected via a valve 192 to the exhaust part 190. When the valve 192 is open, the gas in the chamber 6 is exhausted through the transport opening 66.

Figure 3:
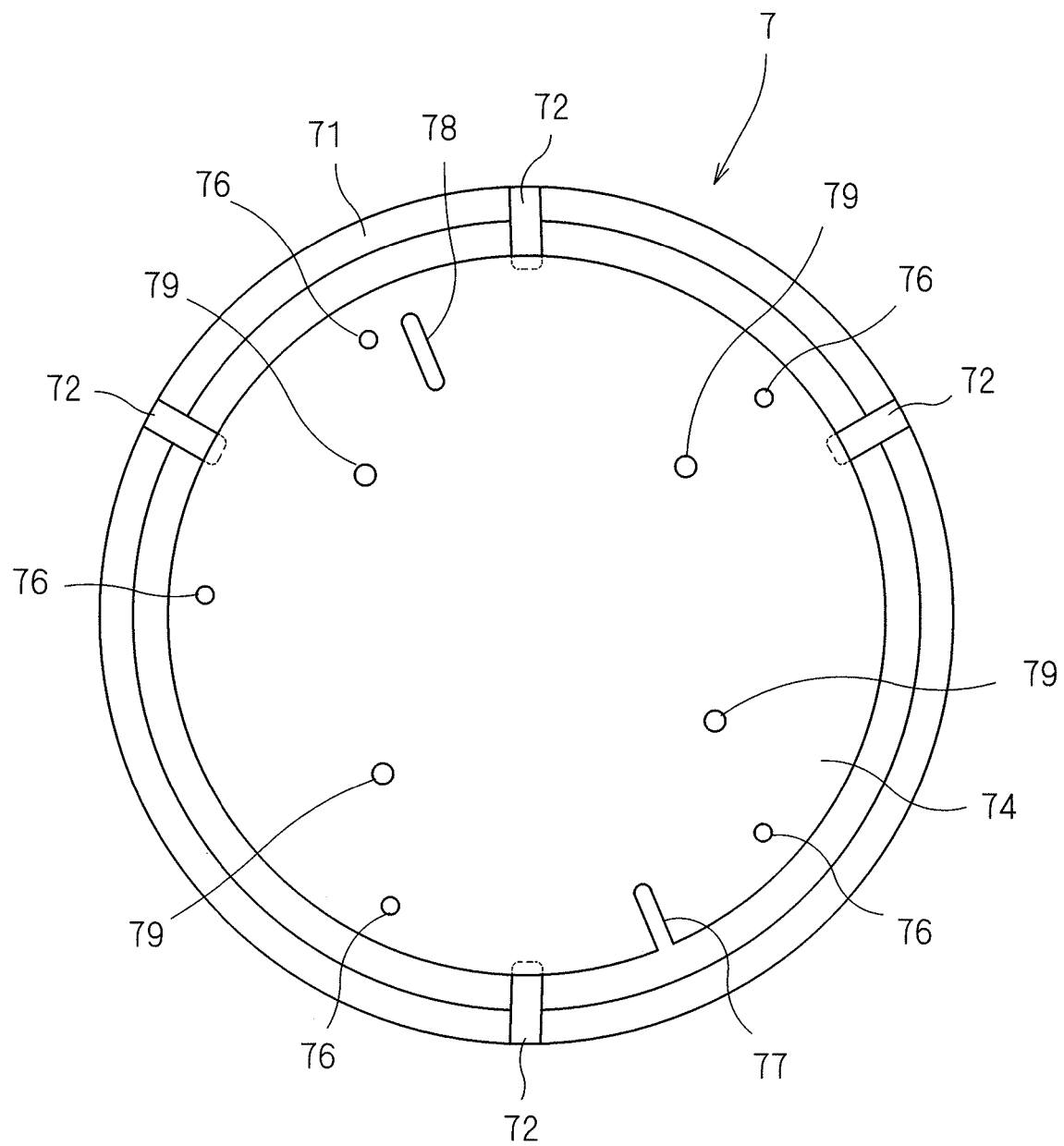
FIG. 3 is a plan view of the holding part as viewed from above.

FIG. 2 is a perspective view illustrating the entire external appearance of the holding part 7. FIG. 3 is a plan view of the holding part 7 as viewed from above, and FIG. 4 is a side view of the holding part 7 as viewed from one side. The holding part 7 includes a base ring 71, connecting parts 72, and a susceptor 74. The base ring 71, the connecting parts 72, and the susceptor 74 are all made of quartz. That is, the entire holding part 7 is made of quartz.

The base ring 71 is an annular quartz member. The base ring 71 is placed on the bottom surface of the recessed portion 62 and supported by the wall surface of the chamber 6 (see FIG. 1). On the upper surface of the base ring 71 having an annular shape, a plurality of (in the present preferred embodiment, four) connecting parts 72 are provided upright in the circumferential direction of the base ring 71. The connecting parts 72 are also quartz members and fixedly attached to the base ring 71 by welding. Note that the base ring 71 may have an arc shape that is an annular shape with a missing part.

The flat plate-like susceptor 74 is supported by the four connecting parts 72 provided on the base ring 71. The susceptor 74 is a generally circular flat plate-like member made of quartz. The diameter of the susceptor 74 is greater than the diameter of the semiconductor wafer W. That is, the susceptor 74 has a plane size greater than the plane size of the semiconductor wafer W. The susceptor 74 has a plurality of (the present preferred embodiment, five) guide pins 76 provided upright on the upper surface. The five guide pins 76 are provided along the circumference of a circle that is concentric with the outer circumferential circle of the susceptor 74. The diameter of the circle along which the five guide pins 76 are located is slightly greater than the diameter of the semiconductor wafer W. Each guide pin 76 is also made of quartz. Note that the guide pins 76 may be processed integrally with the susceptor 74 from a quartz ingot, or may be processed separately from the susceptor 74 and attached to the susceptor 74 by, for example, welding.

The four connecting parts 72 provided upright on the base ring 71 and the lower surface of the peripheral portion of the susceptor 74 are fixedly attached by welding. That is, the susceptor 74 and the base ring 71 are fixedly coupled to each other by the connecting parts 72, making the holding part 7 an integral member of quartz. The base ring 71 of this holding part 7 is supported by the wall surface of the chamber 6, and thereby the holding part 7 is attached to the chamber 6. With the holding part 7 attached to the chamber 6, the generally disk-shaped susceptor 74 is held in a horizontal position (position at which the normal coincides with the vertical direction). The semiconductor wafer W transported into the chamber 6 is placed and held in a horizontal position on the susceptor 74 of the holding part 7 attached to the chamber 6. By disposing the semiconductor wafer W inward of the circle formed by the five guide pins 76, a positional shift of the semiconductor wafer in the horizontal direction is prevented. Note that the number of guide pins 76 is not limited to five, and may be an arbitrary number as long as the positional shift of the semiconductor wafer W is prevented.

As illustrated in FIGS. 2 and 3, the susceptor 74 has a vertically penetrating opening 78 and a cut-out portion 77. The cut-out portion 77 is formed to pass through the probe tip of a contact-type thermometer 130 using a thermocouple. On the other hand, the opening 78 is formed to allow a radiation thermometer 120 to receive radiation (infrared light) applied from the lower surface of the semiconductor wafer W held by the susceptor 74. The susceptor 74 further has four through holes 79 that lift pins 12 of the transfer mechanism 10, which will be described later, pass through to transfer the semiconductor wafer W.

Figure 5:
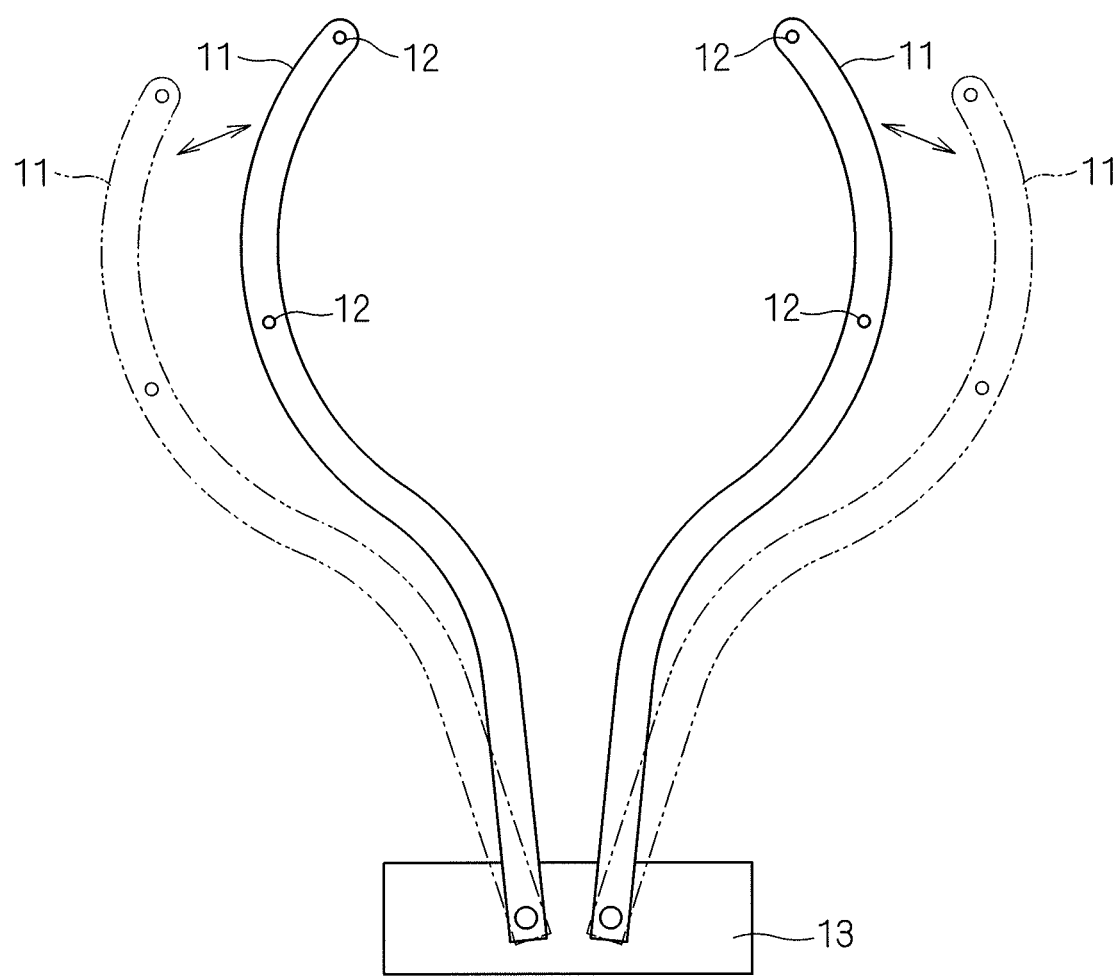
FIG. 5 is a plan view of a transfer mechanism.

FIG. 5 is a plan view of the transfer mechanism 10, and FIG. 6 is a side view of the transfer mechanism 10. The transfer mechanism 10 includes two transfer arms 11. The transfer arms 11 have an arc shape that extends generally along the annular recessed portion 62. The transfer arms 11 each have two upright lift pins 12. Each transfer arm 11 is pivotable by a horizontal movement mechanism 13. The horizontal movement mechanism 13 horizontally moves the pair of transfer arms 11 between a transfer operation position (position indicated by the solid line in FIG. 5) at which the semiconductor wafer W is transferred to the holding part 7 and a retracted position (position indicated by the dashed double-dotted line in FIG. 5) at which the transfer arms 11 do not overlap the semiconductor wafer W held by the holding part 7 in a plan view. The horizontal movement mechanism 13 may be a mechanism for separately pivoting the transfer arms 11 by individual motors, or a mechanism for pivoting the pair of transfer arms 11 in conjunction with each other by a single motor using a link mechanism.

The pair of transfer arms 11 are also movable upward and downward along with the horizontal movement mechanism 13 by an elevating mechanism 14. When the elevating mechanism 14 moves the pair of transfer arms 11 upward at the transfer operation position, the four lift pins 12 pass through the through holes 79 (see FIGS. 2 and 3) of the susceptor 74, and the upper ends of the lift pins 12 protrude from the upper surface of the susceptor 74. On the other hand, when the elevating mechanism 14 moves the pair of transfer arms 11 down at the transfer operation position to pull the lift pins 12 out of the through holes 79 and then the horizontal movement mechanism 13 moves the pair of transfer arms 11 to open the transfer arms 11, each transfer arm 11 is moved to its retracted position. The retracted positions of the pair of transfer arms 11 are directly above the base ring 71 of the holding part 7. Since the base ring 71 is placed on the bottom surface of the recessed portion 62, the retracted positions of the transfer arms 11 are on the inside of the recessed portion 62. Note that an exhaust mechanism (not shown) is also provided in the vicinity of the area where the driving part (the horizontal movement mechanism 13 and the elevating mechanism 14) of the transfer mechanism 10 is provided to allow the atmosphere around the driving part of the transfer mechanism 10 to be exhausted to the outside of the chamber 6.

Referring back to FIG. 1, the flash heating part 5 provided above the chamber 6 includes, inside a casing 51, a light source that includes a plurality of (in the present preferred embodiment, 30) built-in xenon flash lamps FL, and a reflector 52 provided to cover the top of the light source. The casing 51 of the flash heating part 5 also has a lamp light irradiation window 53 attached to the bottom. The lamp light irradiation window 53, which forms the floor of the flash heating part 5, is a plate-like quartz window made of quartz. Since the flash heating part 5 is located above the chamber 6, the lamp light irradiation window 53 opposes the upper chamber window 63. The flash lamps FL emit flash light from above the chamber 6 through the lamp light irradiation window 53 and the upper chamber window 63 to the heat treatment space 65.

The flash lamps FL are each a rod-shaped lamp having an elongated cylindrical shape and are arrayed in a plane such that their longitudinal directions are parallel to one another along the major surface of the semiconductor wafer W held by the holding part 7 (i.e., along the horizontal direction). Thus, the plane formed by the array of the flash lamps FL is also a horizontal plane.

The xenon flash lamps FL each include a rod-shaped glass tube (discharge tube) and a trigger electrode provided on the outer circumferential surface of the glass tube, the glass tube containing a xenon gas sealed therein and including an anode and a cathode that are disposed at opposite ends of the glass tube and connected to a capacitor. Since the xenon gas is electrically an insulator, no electricity passes through the glass tube in a normal state even if electric charge is stored in the capacitor. However, if an electrical breakdown occurs due to the application of a high voltage to the trigger electrode, the electricity stored in the capacitor instantaneously flows through the glass tube, and light is emitted as a result of the excitation of xenon atoms or molecules at that time. These xenon flash lamps FL have the properties of being capable of applying extremely intense light as compared with a continuous lighting light source such as halogen lamps HL because the electrostatic energy previously stored in the capacitor is converted into an extremely short optical pulse of 0.1 to 100 milliseconds.

The reflector 52 is provided above the flash lamps FL to cover all of the flash lamps FL. A basic function of the reflector 52 is to reflect the flash light emitted from the flash lamps FL toward the heat treatment space 65. The reflector 52 is made of an aluminum alloy plate, and the surface (surface facing the flash lamps FL) of the reflector 52 is roughened by blasting.

The halogen heating part 4 located below the chamber 6 includes a plurality of (in the present preferred embodiment, 40) build-in halogen lamps HL inside a casing 41. The halogen heating part 4 is a light irradiation part that heats the semiconductor wafer W with the halogen lamps HL that emit light from below the chamber 6 through the lower chamber window 64 to the heat treatment space 65.

Figure 7:
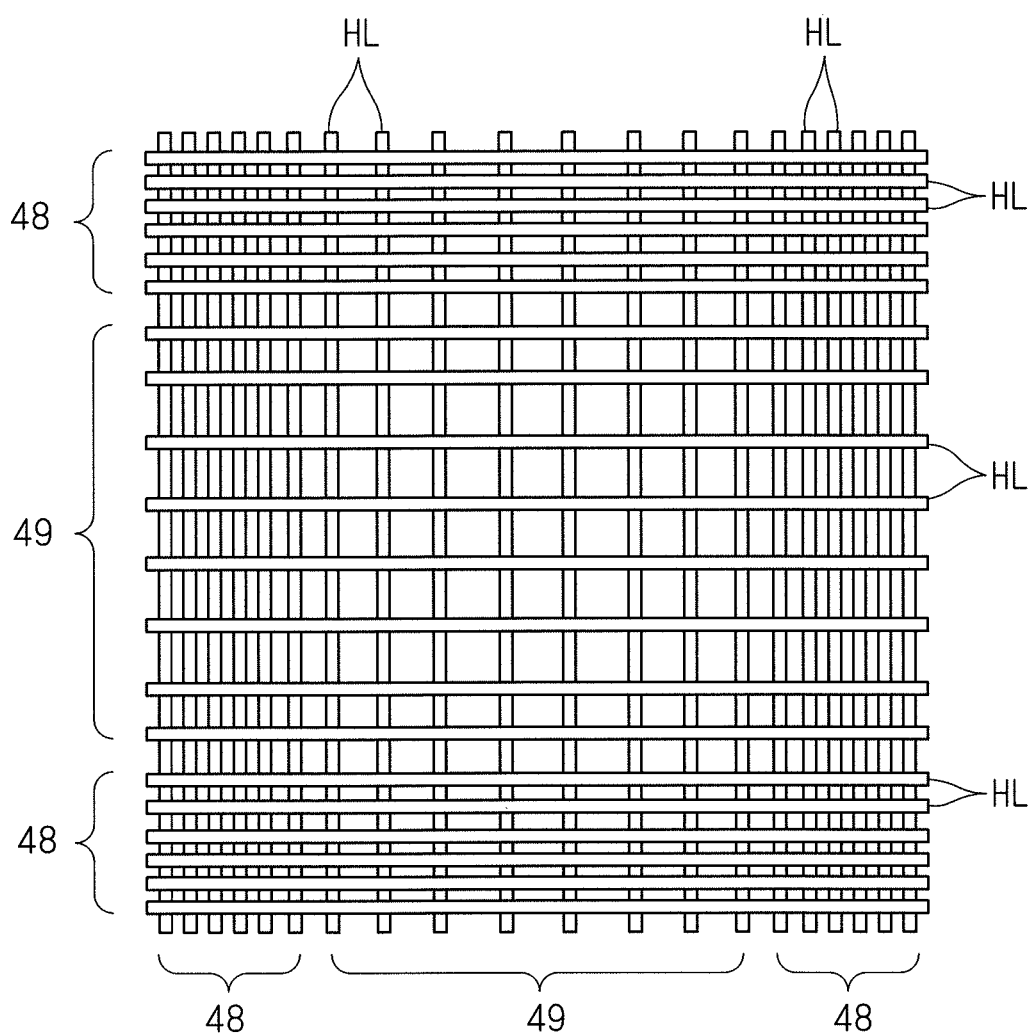
FIG. 7 is a plan view illustrating the layout of a plurality of halogen lamps.

FIG. 7 is a plan view illustrating the layout of the halogen lamps HL. In the first preferred embodiment, a plurality of halogen lamps HL are arranged in a region greater than the main surface (i.e., 300-mm circle) of the disk-shaped semiconductor wafer W held by the holding part 7. The halogen lamps HL are also arranged in a light source region that opposes the lower main surface of the semiconductor wafer W.

As illustrated in FIGS. 1 and 7, in the first preferred embodiment, the 40 halogen lamps HL are divided into and arranged in upper and lower rows. The upper row closer to the holding part 7 includes an array of 20 halogen lamps HL, and the lower row located further to the holding part 7 than the upper row includes an array of 20 halogen lamps HL. Each halogen lamp HL is a rod-shaped lamp having an elongated cylindrical shape. The 20 halogen lamps HL in the upper row and the 20 halogen lamps HL in the lower row are respectively arranged such that their longitudinal directions are parallel to one another along the major surface of the semiconductor wafer W held by the holding part 7 (i.e., in the horizontal direction). Thus, the plane formed by the array of the halogen lamps HL in the upper row and the plane formed by the array of the halogen lamps HL in the lower row are both horizontal planes.

Also, a lamp group of the halogen lamps HL in the upper row and a lamp group of the halogen lamps HL in the lower rows are arranged to intersect each other in grids. That is, the total of 40 halogen lamps HL are located such that the longitudinal direction of the 20 halogen lamps HL in the upper row and the longitudinal direction of the 20 halogen lamps HL in the lower row are orthogonal to each other.

The halogen lamps HL are filament-type light sources that pass current through a filament disposed in the glass tube to make the filament incandescent, thereby emitting light. Inside the glass tube is sealed a gas prepared by introducing a trace amount of halogen element (e.g., iodine or bromine) into an inert gas such as nitrogen or argon. The introduction of the halogen element allows the temperature of the filament to be set at a high temperature while suppressing breakage of the filament. Thus, the halogen lamps HL have the properties of having a longer life than typical incandescent lamps and being capable of continuously applying intense light. That is, the halogen lamps HL are continuous lighting lamps that continuously emit light for at least one or more seconds. Moreover, the halogen lamps HL as rod-shaped lamps have a long life, and disposing theses halogen lamps HL in the horizontal direction enhances the efficiently of radiation of the semiconductor wafer W located above the halogen lamps.

As illustrated in FIG. 7, in each of the upper and lower rows, the halogen lamps HL are disposed at a higher density in the region that opposes the peripheral portion of the semiconductor wafer W held by the holding part 7 than in the region that opposes the central portion of the semiconductor wafer W. That is, in each of the upper and lower rows, the halogen lamps HL are disposed at a shorter pitch in a peripheral portion 48 of the light source region than in a central portion 49 thereof. In addition, the halogen lamps HL located in the peripheral portion 48 of the light source region have a higher filament winding density than the halogen lamps HL located in the central part 49. This configuration markedly increases the intensity of illumination from the peripheral portion 48 of the light source region, as compared with the intensity of illumination from the central part 49, and allows a greater amount of light to be applied to the peripheral portion of the semiconductor wafer W where a temperature drop is likely to occur when the semiconductor wafer W is heated with the light emitted from the halogen heating part 4.

The casing 41 of the halogen heating part 4 also includes a reflector 43 under the two rows of halogen lamps HL (FIG. 1). The reflector 43 reflects the light emitted from the halogen lamps HL to the heat treatment space 65.

The louver 21 and the light-shielding member 25 are provided between the halogen heating part 4 and the holding part 7. FIG. 8 is a perspective view of the louver 21. The louver 21 is a cylindrical (bottomless cylindrical) member with upper and lower opening ends. The louver 21 is made of a material that is impervious to the light emitted from the halogen lamps HL of the halogen heating part 4, and for example, made of opaque quartz with a large number of superfine air bubbles contained in quartz glass. The size of the louver 21 may be appropriately optimized for the locations and configurations of the chamber 6 and the halogen heating part 4. The cylinder of the louver 21 only needs to have an outer diameter smaller than the light source region where the halogen lamps HL are located, and in the first preferred embodiment, for example, the outer diameter of the louver 21 is 300 mm, which is the same as the diameter of the semiconductor wafer W, and the inner diameter of the louver 21 is 294 mm. The height of the louver 21 only needs to be in the range of 15 to 25 mm (in the first preferred embodiment, 16 mm).

As illustrated in FIG. 1, a louver stage 22 is located on the upper end of the casing 41 of the halogen heating part 4. The louver stage 22 is a flat plate-like member made of quartz glass having transparency to the light emitted from the halogen lamps HL. The louver 21 is installed on the upper surface of this louver stage 22. The louver 21 is installed such that its cylinder has a central axis CX that passes through the center of the semiconductor wafer W held by the holding part 7. The halogen lamps HL of the halogen heating part 4 are arrayed in a region that opposes the lower surface of the semiconductor wafer W held by the holding part 7. Thus, the central axis CX of the louver 21 also passes through the center of the array of the halogen lamps HL.

With the cylindrical louver 21 of opaque quartz located between the halogen heating part 4 and the chamber 6, light travelling from halogen lamps HL located outward of the louver 21 toward an inner region (i.e., region located inward of the peripheral portion) of the semiconductor wafer W, which includes the vicinity of the central portion, is blocked off by the wall surface of the opaque louver 21 during light emission from the halogen lamps HL. On the other hand, light travelling from halogen lamps HL located outward of the louver 21 toward the peripheral portion of the semiconductor wafer W is not blocked. As a result, in the presence of the louver 21, the amount of light travelling from the halogen heating part 4 toward the peripheral portion of the semiconductor wafer W is almost not reduced at all, whereas the amount of light travelling toward the inner region is reduced. Thus, the inner region is weakly heated, and the peripheral portion of the semiconductor wafer W where a temperature drop is likely to occur is relatively strongly heated.

However, the inventors of the present invention have newly found out after active investigations that simply installing only the louver 21 above the halogen heating part 4 may, on the contrary, increase the temperature of a region that is located slightly inward of the peripheral portion of the semiconductor wafer W during light emission from halogen lamps HL for heating. FIG. 14 illustrates a temperature distribution in the surface of the semiconductor wafer W when only the louver 21 is installed. If only the louver 21 is simply installed and light is emitted from the halogen lamps HL, overheat regions (hot spots) 99 having higher temperatures than the other region appear slightly inward of the peripheral portion of the semiconductor wafer W, as illustrated in FIG. 14. For example, when the semiconductor wafer W has a diameter of 300 mm, such overheat regions 99 appear around within a radius of about 117 mm in the surface of the semiconductor wafer W. That is, the overheat regions 99 have an arc shape having a diameter of about 235 mm.

In view of this, the present invention provides the light-shielding member 25, in addition to the louver 21, between the halogen heating part 4 and the holding part 7. FIG. 9 is a perspective view illustrating the entire external appearances of the louver 21 and the light-shielding member 25 according to the first preferred embodiment. A ring stage 24 is installed on the upper end of the cylindrical louver 21. The ring stage 24 is a disk-shaped member made of quartz glass having transparency to the light emitted from the halogen lamps HL. The diameter of the ring stage 24 is the same as the outer diameter of the louver 21 (in the present embodiment, 300 mm). The ring stage 24 has a plate thickness of 2 to 3 mm.

The light-shielding member 25 is disposed on the upper surface of the ring stage 24. That is, in the first preferred embodiment, the light-shielding member 25 is further disposed on the ring stage 24, which is a quartz plate provided on the louver 21. The light-shielding member 25 is an annular flat plate-like light-shielding ring. The light-shielding member 25 is made of a material that is impervious to the light emitted from the halogen lamps HL of the halogen heating part 4, and for example, made of opaque quartz with a large number of superfine air bubbles contained in quartz glass. In the first preferred embodiment, the louver 21 and the light-shielding member 25 are made of the same material.

The outer diameter of the annular light-shielding member 25 is smaller than the inner diameter of the cylindrical louver 21, and for example, 280 mm. That is, the outer dimensions of the light-shielding member 25 are smaller than the inner dimensions of the louver 21. The light-shielding member 25 has an inner diameter of, for example, 260 mm, and a plate thickness of, for example, 2 mm.

The central axis CX of the louver 21 coincides with the central axis of the annular light-shielding member 25. Thus, the light-shielding member 25 is located such that its annular shape has a central axis that passes through the center of the semiconductor wafer W held by the holding part 7.

Referring back to FIG. 1, the controller 3 controls various operating mechanisms of the heat treatment apparatus 1 described above. The hardware configuration of the controller 3 is similar to the configuration of a typical computer. That is, the controller 3 includes a CPU that is a circuit for performing various types of computations, a ROM that is a read-only memory for storing basic programs, a RAM that is a readable/writable memory for storing various types of information, and a magnetic disk for storing software and data for control. The processing of the heat treatment apparatus 1 is implemented by the CPU of the controller 3 executing predetermined processing programs.

The heat treatment apparatus 1 also includes, in addition to the above-described constituent elements, various cooling structures in order to prevent an excessive temperature increase in the halogen heating part 4, the flash heating part 5, and the chamber 6 due to heat energy generated by the halogen lamps HL and the flash lamps FL during heat treatment of the semiconductor wafer W. For example, a water-cooled tube (not shown) is provided in the wall of the chamber 6. The halogen heating part 4 and the flash heating part 5 also have an air cooling structure that forms a gas flow in its interior to exhaust heat. Also, air is supplied to the clearance between the upper chamber window 63 and the lamp light irradiation window 53 to cool the flash heating part 5 and the upper chamber window 63.

Next, the procedure of processing performed on the semiconductor wafer W by the heat treatment apparatus 1 will be described. The semiconductor wafer W to be processed here is a semiconductor substrate doped with impurities (ions) by ion implantation. These impurities are activated through heat treatment (annealing) involving the application of flash light by the heat treatment apparatus 1. The following procedure of processing performed by the heat treatment apparatus 1 is implemented by the controller 3 controlling each operating mechanism of the heat treatment apparatus 1.

First, the valve 84 for supplying a gas and the valves 89 and 192 for exhausting a gas are opened to start the supply and exhaust of a gas into and from the chamber 6. When the valve 84 is opened, a nitrogen gas is supplied from the gas supply port 81 into the heat treatment space 65. When the valve 89 is opened, the gas in the chamber 6 is exhausted from the gas exhaust port 86. Thereby, the nitrogen gas supplied from above the heat treatment space 65 in the chamber 6 flows down and is exhausted from below the heat treatment space 65.

When the valve 192 is opened, the gas in the chamber 6 is also exhausted from the transport opening 66. Moreover, the atmosphere around the driving part of the transfer mechanism 10 is also discharged by an exhaust mechanism (not shown). During the heat treatment of the semiconductor wafer W in the heat treatment apparatus 1, the nitrogen gas continues to be supplied into the heat treatment space 65, and the amount of the nitrogen gas supplied is changed as appropriate in accordance with the processing step.

Then, the gate valve 185 is opened to open the transport opening 66, and the ion-implanted semiconductor wafer W is transported into the heat treatment space 65 of the chamber 6 through the transport opening 66 by a transport robot located outside the apparatus. The semiconductor wafer W transported into the heat treatment space 65 by the transport robot is moved to a position directly above the holding part 7 and stopped. Then, the pair of transfer arms 11 of the transfer mechanism 10 moves horizontally from the retracted position to the transfer operation position and moves upward, so that the lift pins 12 pass through the through holes 79 and protrude from the upper surface of the susceptor 74 to receive the semiconductor wafer W.

After the semiconductor wafer W is placed on the lift pins 12, the transport robot retracts from the heat treatment space 65, and the transport opening 66 is closed with the gate valve 185. Then, the pair of transfer arms 11 moves down, and thereby the semiconductor wafer W is transferred from the transfer mechanism 10 to the susceptor 74 of the holding part 7 and held in a horizontal position from the underside. The semiconductor wafer W is held by the holding part 7 with its impurity-doped surface with a pattern facing upward. The semiconductor wafer W is also held inward of the five guide pins 76 on the upper surface of the susceptor 74. The two transfer arms 11 that have moved down to positions below the susceptor 74 are retracted to their retracted positions, i.e., to the inside of the recessed portion 62, by the horizontal movement mechanism 13.

After the semiconductor wafer W is held in a horizontal position from the underside by the holding part 7 made of quartz, all of the 40 halogen lamps HL of the halogen heating part 4 are turned on in unison to start preheating (assist-heating). The halogen light emitted from the halogen lamps HL passes through the louver stage 22, the ring stage 24, the lower chamber window 64, and the susceptor 74, which are made of quartz, and is applied from the rear surface (main surface on the opposite side to the front surface) of the semiconductor wafer W. The semiconductor wafer W that has received the light emitted from the halogen lamps HL is preheated, and thereby the temperature of the semiconductor wafer W increases. Note that the transfer arms 11 of the transfer mechanism 10 that have retracted to the inside of the recessed portion 62 do not impede the heating with the halogen lamps HL.

During preheating with the halogen lamps HL, the temperature of the semiconductor wafer W is measured with the contact-type thermometer 130. Specifically, the contact-type thermometer 130 with a built-in thermocouple is brought into contact with the lower surface of the semiconductor wafer W held by the holding part 7 through the cut-out portion 77 of the susceptor 74 and measures the increasing wafer temperature. The measured temperature of the semiconductor wafer W is transmitted to the controller 3. The controller 3 monitors whether the temperature of the semiconductor wafer W that is increasing due to the application of light from the halogen lamps HL has reached a predetermined preheating temperature T1. The preheating temperature T1 is set to about 200° C. to 800° C. at which the impurities doped in the semiconductor wafer W are not caused to be diffused by heat, and preferably, may be set to about 350° C. to 600° C. (in the present embodiment, 600° C.). Note that when the temperature of the semiconductor wafer W is increased by the application of light from the halogen lamps HL, the radiation thermometer 120 does not measure the temperature. This is because accurate temperature measurement is difficult due to the halogen light from the halogen lamps HL entering the radiation thermometer 120 as disturbance light.

Figure 10:
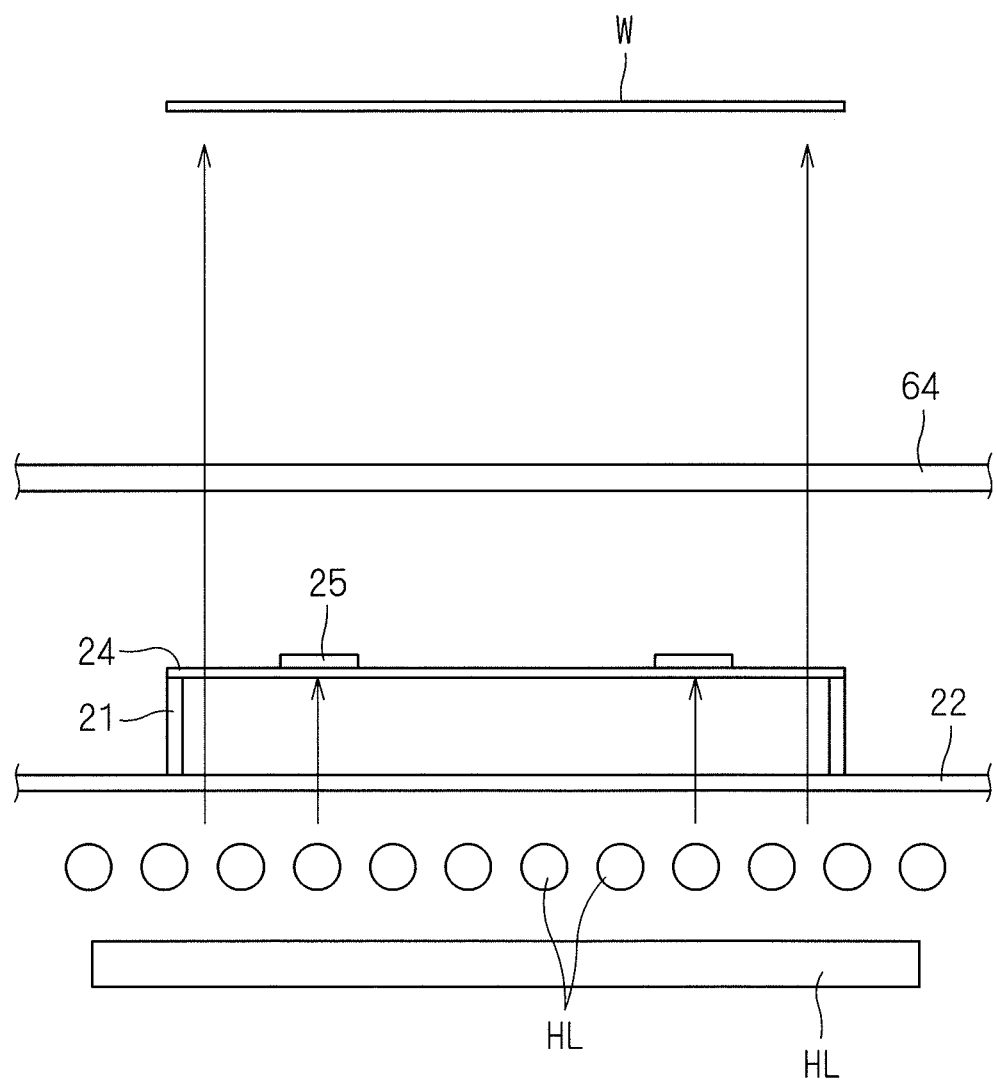
FIG. 10 illustrates how the optical path is controlled by the louver and the light-shielding member.

In the first preferred embodiment, the opaque cylindrical louver 21 and the annular light-shielding member 25 are provided between the halogen heating part 4 and the chamber 6 and blocks off part of the light travelling from the halogen heating part 4 toward the semiconductor wafer W held by the holding part 7. FIG. 10 illustrates how the optical path is controlled by the louver 21 and the light-shielding member 25 according to the first preferred embodiment.

As described above, in the present embodiment, the halogen lamps HL are disposed in the region greater than the main surface of the disk-shaped semiconductor wafer W, and the outer diameter of the louver 21 is the same as the diameter of the semiconductor wafer W. Thus, some of the halogen lamps HL are located outward of the cylindrical louver 21. This configuration allows the light travelling from the halogen lamps HL located outward of the louver 21 toward the inner region (region located inward of the peripheral portion) of the semiconductor wafer W, including the vicinity of the central portion, to be blocked off by the wall surface of the opaque louver 21. On the other hand, the light travelling from the halogen lamps HL located outward of the louver 21 toward the peripheral portion of the semiconductor wafer W is not blocked.

Also, the central axis of the annular light-shielding member 25 coincides with the central axis CX of the louver 21, and the outer diameter of the light-shielding member 25 is smaller than the inner diameter of the louver 21. Thus, a clearance that allows the light emitted from the halogen lamps HL to transmit is present between the inner wall surface of the louver 21 and the outer circumference of the light-shielding member 25 as illustrated in FIG. 10. In the first preferred embodiment in which the louver 21 has an inner diameter of 294 mm and the light-shielding member 25 has an outer diameter of 280 mm, a 7-mm wide annular clearance is created between the inner wall surface of the louver 21 and the outer circumference of the light-shielding member 25. The clearance is located immediately under the peripheral portion of the semiconductor wafer W because the outer diameter of the louver 21 is the same as the diameter of the semiconductor wafer W held by the holding part 7. Accordingly, as illustrated in FIG. 10, the light emitted from the halogen lamps HL and passing through the clearance between the inner wall surface of the louver 21 and the outer periphery of the light-shielding member 25 is applied to the peripheral portion of the semiconductor wafer W held by the holding part 7. This configuration, combined with the light-shielding effect of the louver 21 described above, relatively increases the intensity of illumination of the peripheral portion of the semiconductor wafer W with the light emitted from the halogen lamps HL and allows the peripheral portion where a temperature drop is likely to occur to be strongly heated.

On the other hand, the opaque annular light-shielding member 25 having an outer diameter of 280 mm and an inner diameter of 260 mm is located below a region that is slightly inward of the peripheral portion of the semiconductor wafer W held by the holding part 7, i.e., below the overheat regions 99 in FIG. 14 that appear when only the louver 21 is installed. Thus, the light emitted from the halogen lamps HL and travelling toward the overheat regions 99 located slightly inward of the peripheral portion of the semiconductor wafer W is blocked off by the light-shielding member 25 as illustrated in FIG. 10. This configuration relatively reduces the intensity of illumination of the overheat regions 99 of the semiconductor wafer W, which appear when only the louver 21 is installed, and reduces the application of heat to the overheat regions 99.

In this way, the combination of the louver 21 and the light-shielding member 25 increases the intensity of illumination of the peripheral portion of the semiconductor wafer W with the light emitted from the halogen lamps HL, and at the same time, reduces the intensity of illumination of the overheat regions 99 that are located slightly inward of the peripheral portion of the semiconductor wafer W. As a result, the peripheral portion of the semiconductor wafer W where a temperature drop is likely to occur is relatively strongly heated, and the overheat regions 99 located slightly inward of the peripheral portion and having a temperature that may increase excessively when only the louver 21 is installed is relatively weakly heated. This configuration effectively resolves unevenness of the temperature distribution in the surface of the semiconductor wafer W during preheating.

When a predetermined amount of time has elapsed after the temperature of the semiconductor wafer W reached the preheating temperature T1, flash light is applied from the flash lamps FL of the flash heating part 5 to the surface of the semiconductor wafer W. At this time, part of the flash light emitted from the flash lamps FL travels directly into the chamber 6, and part of the flash light is reflected by the reflector 52 and then travels into the chamber 6. The application of such flash light enables flash heating of the semiconductor wafer W.

The flash heating implemented by the application of flash light from the flash lamps FL allows the surface temperature of the semiconductor wafer W to be increased in a short time. That is, the flash light emitted from the flash lamps FL is extremely short intense flash light that is obtained by converting the electrostatic energy previously stored in the capacitor into an extremely short optical pulse and that has an irradiation time of about 0.1 to 100 milliseconds. The surface temperature of the semiconductor wafer W heated with the flash light emitted from the flash lamps FL instantaneously rises to a treatment temperature T2 of 1000° C. or higher, and then drops rapidly after the activation of impurities doped in the semiconductor wafer W. In this way, the heat treatment apparatus 1 allows the surface temperature of the semiconductor wafer W to rise and drop in an extremely short time, and thereby enables the activation of impurities doped in the semiconductor wafer W while suppressing the diffusion of impurities due to heat. Since the time required for the activation of impurities is extremely shorter than the time required for heat diffusion of impurities, the activation is completed even in such a short time of about 0.1 to 100 milliseconds that causes no diffusion.

In the first preferred embodiment, the louver 21 and the light-shielding member 25 block off part of the light travelling from the halogen heating part 4 toward the inner region (in particular, overheat regions 99) of the semiconductor wafer W to make uniform the temperature distribution in the surface of the semiconductor wafer W at the preheating stage. This configuration also allows the temperature distribution in the surface of the semiconductor wafer W to be uniform during the application of flash light.

After the flash heating process is completed and a predetermined period of time has elapsed, the halogen lamps HL are turned off. The temperature of the semiconductor wafer W thus rapidly drops from the preheating temperature T1. The decreasing temperature of the semiconductor wafer W is measured with the contact-type thermometer 130 or the radiation thermometer 120, and the measurement result is transmitted to the controller 3. On the basis of the measurement result, the controller 3 monitors whether the temperature of the semiconductor wafer W has dropped to a predetermined temperature. After the temperature of the semiconductor wafer W has dropped to the predetermined temperature or less, the two transfer arms 11 of the transfer mechanism 10 are moved horizontally again from the retracted positions to the transfer operation position and moved upward, so that the lift pins 12 protrude from the upper surface of the susceptor 74 and receive the heat-treated semiconductor wafer W from the susceptor 74. Then, the transport opening 66 closed by the gate valve 185 is opened and the semiconductor wafer W placed on the lift pins 12 is transported out of the apparatus by the transport robot. This completes the heat treatment of the semiconductor wafer W in the heat treatment apparatus 1.

In the first preferred embodiment, the opaque cylindrical louver 21 and the annular light-shielding member 25 are provided between the halogen heating part 4 and the chamber 6 to control the optical path of the light travelling from the halogen heating part 4 toward the semiconductor wafer W held by the holding part 7. As described previously, in the case where preheating by the halogen heating part 4 is conducted with only the louver 21 installed, the overheat regions 99 having higher temperatures than the other region tend to appear slightly inward of the peripheral portion of the semiconductor wafer W. In view of this, the light-shielding member 25 is also provided, in addition to the louver 21, to block off the light travelling toward the overheat regions 99, which are located slightly inward of the peripheral portion of the semiconductor wafer W. This configuration allows the temperature distribution in the surface of the semiconductor wafer W to be uniform during preheating and consequently allows the temperature distribution in the surface of the semiconductor wafer W to be uniform during flash heating.

Second Preferred Embodiment

Next, a second preferred embodiment according to the present invention will be described. The overall configuration of a heat treatment apparatus of the second preferred embodiment is approximately the same as the configuration of the first preferred embodiment. The procedure of processing performed on the semiconductor wafer W in the second preferred embodiment is also the same as the procedure in the first preferred embodiment. The second preferred embodiment is different from the first preferred embodiment in the shape of a light-shielding member.

Figure 11:
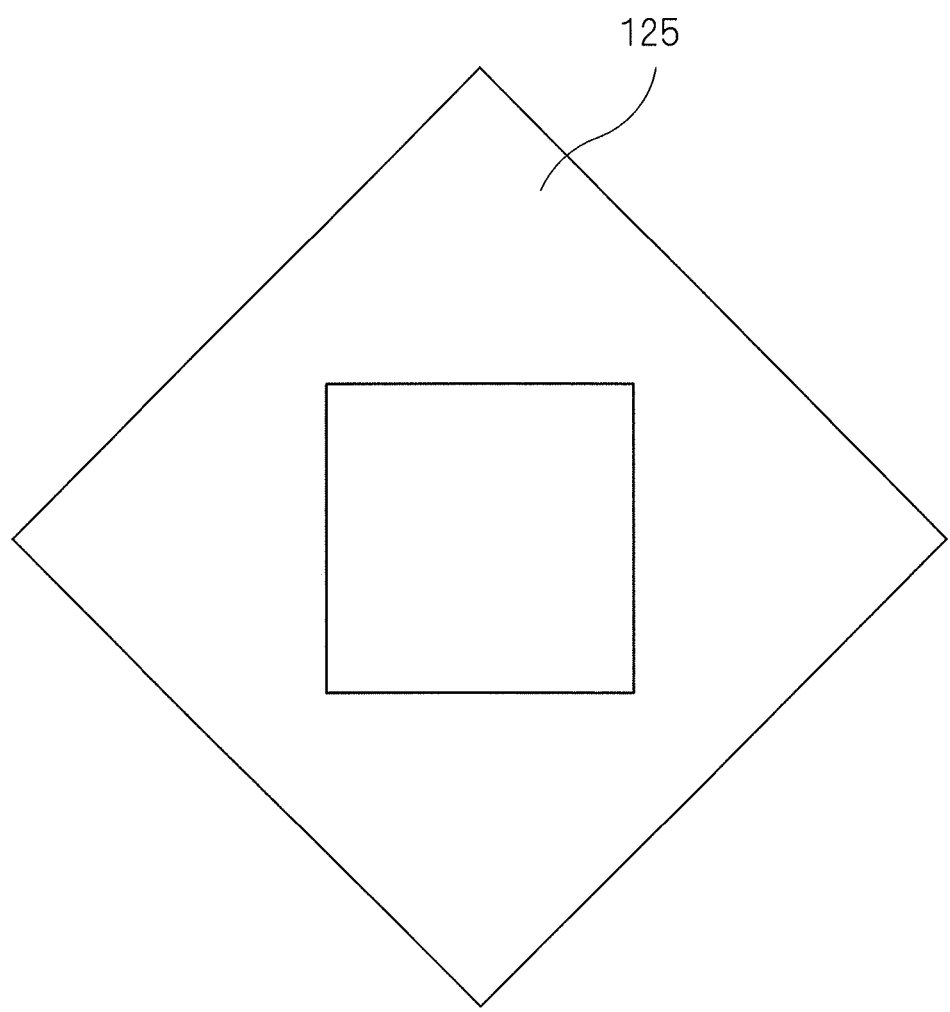
FIG. 11 is a plan view of a light-shielding member according to a second preferred embodiment.

FIG. 11 is a plan view of a light-shielding member 125 of the second preferred embodiment. While the light-shielding member 25 of the first preferred embodiment is an annular flat plate-like light-shielding ring, the light-shielding member 125 of the second preferred embodiment is a square plate-like member having a square hole in the center. The light-shielding member 125 of the second preferred embodiment can also be called an annular flat plate-like member. As in the first preferred embodiment, the light-shielding member 125 is made of a material that is impervious to the light emitted from the halogen lamps HL of the halogen heating part 4, and for example, made of opaque quartz with a large number of superfine air bubbles contained in quartz glass.

The length of a diagonal line of the square light-shielding member 125 is smaller than the inner diameter of the cylindrical louver 21. The light-shielding member 125 has a plate thickness of, for example, 2 mm. This light-shielding member 125 is disposed on the upper surface of the ring stage 24 provided on the upper end of the cylindrical louver 21. The rest of the configuration of the second preferred embodiment, excluding the shape of the light-shielding member 125, is the same as the configuration of the first preferred embodiment.

In the second preferred embodiment, when the semiconductor wafer W is preheated by the application of light from the halogen heating part 4, light emitted from the halogen lamps HL and passing through the clearance between the inner wall surface of the louver 21 and the outer circumference of the light-shielding member 125 is applied to the peripheral portion of the semiconductor wafer W held by the holding part 7. On the other hand, light emitted from the halogen lamps HL and travelling toward the region of the semiconductor wafer W located inward of the peripheral portion is blocked off by the light-shielding member 125. This allows the temperature distribution in the surface of the semiconductor wafer W to be uniform during preheating and consequently allows the temperature distribution in the surface of the semiconductor wafer W to be uniform during flash heating, as in the first preferred embodiment.

In particular, when preheating by the halogen heating part 4 is conducted with only the louver 21 installed, overheat regions that appear in the surface of the semiconductor wafer W and have higher temperatures than the other region may have a shape as illustrated in FIG. 11. In this case, the temperature distribution in the surface of the semiconductor wafer W is effectively made uniform by the light-shielding member 125 of the second preferred embodiment blocking off the light travelling toward the overheat regions.

Third Preferred Embodiment

Next, a third preferred embodiment of the present invention will be described. The overall configuration of a heat treatment apparatus of the third preferred embodiment is approximately the same as the configuration of the first preferred embodiment. The procedure of processing performed on the semiconductor wafer W in the third preferred embodiment is also the same as the procedure of the first preferred embodiment. The third preferred embodiment is different from the first preferred embodiment in the shape of a light-shielding member.

FIG. 12 is a plan view of a light-shielding member 225 of the third preferred embodiment. The light-shielding member 225 of the third preferred embodiment is configured by a plurality of light-shielding parts, with four plate-like light-shielding pieces 222 being located inward of an annular flat plate-like light-shielding ring 221. The light-shielding ring 221 and the four light-shielding pieces 222, which constitute the light-shielding member 225, are made of a material that is impervious to the light emitted from the halogen lamps HL of the halogen heating part 4, and for example, made of opaque quartz with a large number of superfine air bubbles contained in quartz glass.

The light-shielding ring 221 is similar to the light-shielding member 25 of the first preferred embodiment. That is, the outer diameter of the light-shielding ring 221 is smaller than the inner diameter of the cylindrical louver 21. Each light-shielding piece 222 is a rectangular plate-like member having dimensions that allows the light-shielding piece 222 to be located within the light-shielding ring 221. The light-shielding ring 221 and the four light-shielding pieces 222 are disposed in the layout as illustrated in FIG. 12 on the upper surface of the ring stage 24 provided on the upper end of the cylindrical louver 21. The rest of the configuration of the third preferred embodiment, excluding the shape of the light-shielding member 225, is the same as the configuration of the first preferred embodiment.

In the third preferred embodiment, when the semiconductor wafer W is preheated by the application of light from the halogen heating part 4, light emitted from the halogen lamps HL and passing through the clearance between the inner wall surface of the louver 21 and the outer circumference of the light-shielding ring 221 is applied to the peripheral portion of the semiconductor wafer W held by the holding part 7. On the other hand, part of the light emitted from the halogen lamps HL and travelling toward the region of the semiconductor wafer W located inward of the peripheral portion is blocked off by the light-shielding ring 221 and the light-shielding pieces 222. This configuration allows the temperature distribution in the surface of the semiconductor wafer W to be uniform during preheating and consequently allows the temperature distribution in the surface of the semiconductor wafer W to be uniform during flash heating, as in the first preferred embodiment.

In particular, when preheating by the halogen heating part 4 is conducted with only the louver 21 installed, not only overheat regions 99 having a shape as illustrated in FIG. 14 but also other overheat regions may also appear inward of the overheat regions 99 in the surface of the semiconductor wafer W. In this case, light travelling toward those overheat regions is separately blocked off by the light-shielding pieces 222 provided in addition to the light-shielding ring 221 as in the third preferred embodiment. This configuration allows the temperature distribution in the surface of the semiconductor wafer W to be effectively uniform.

Fourth Preferred Embodiment

Next, a fourth preferred embodiment of the present invention will be described. The overall configuration of a heat treatment apparatus of the fourth preferred embodiment is approximately the same as the configuration of the first preferred embodiment. The procedure of processing performed on the semiconductor wafer W in the fourth preferred embodiment is also the same as the procedure of the first preferred embodiment. The fourth preferred embodiment is different from the first preferred embodiment in the shape of a light-shielding member.

Figure 13:
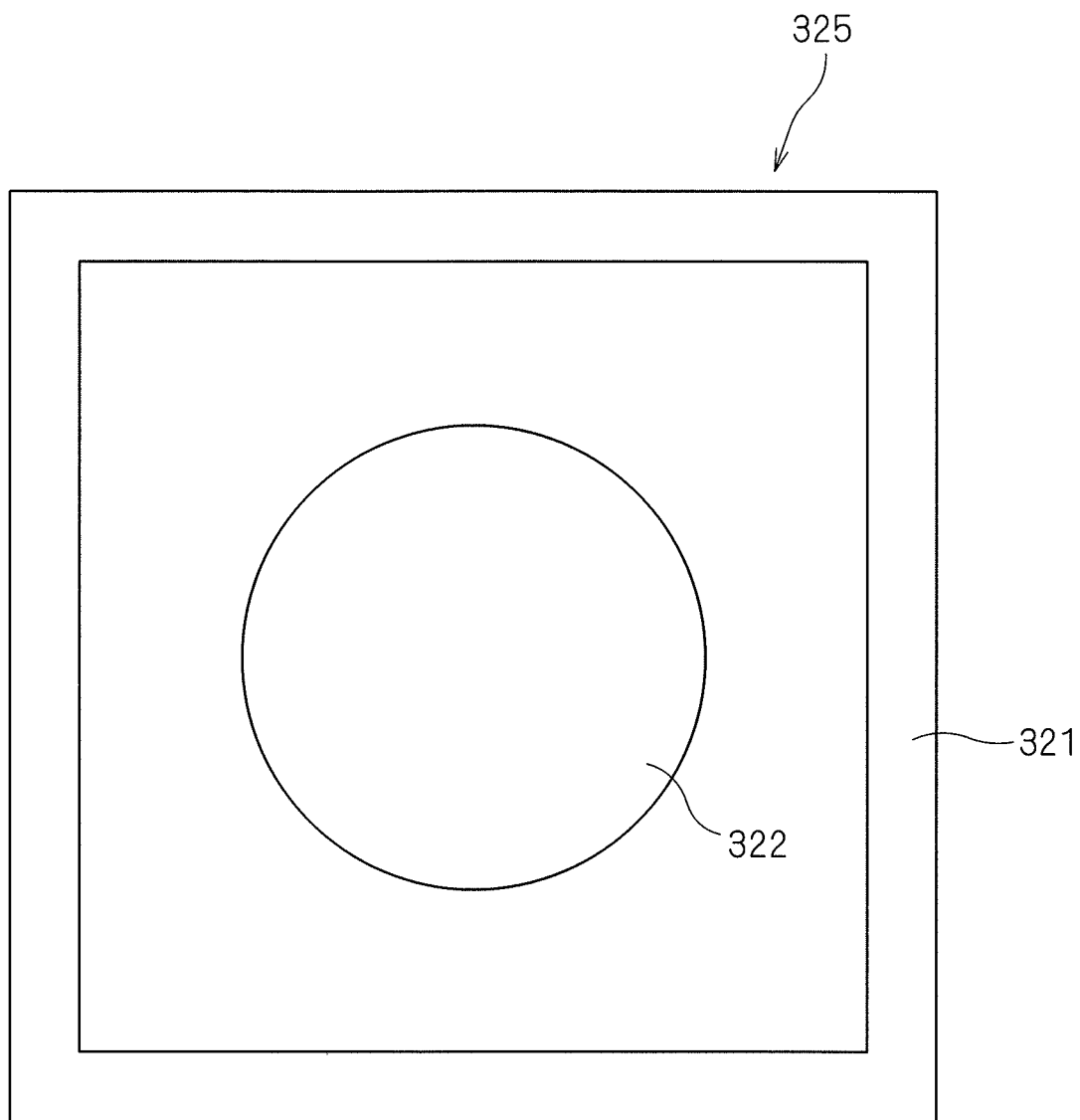
FIG. 13 is a plan view of a light-shielding member according to a fourth preferred embodiment.

FIG. 13 is a plan view of a light-shielding member 325 of the fourth preferred embodiment. The light-shielding member 325 of the fourth preferred embodiment is configured by a plurality of light-shielding parts, with a plate-like light-shielding piece 322 disposed inward of a flat square frame-like light-shielding frame 321. The light-shielding frame 321 and the light-shielding piece 322, which constitute the light-shielding member 325, is made of a material that is impervious to the light emitted from the halogen lamps HL of the halogen heating part 4, and for example, made of opaque quartz with a large number of superfine air bubbles contained in quartz glass.

The length of a diagonal line of the square frame-like light-shielding frame 321 is smaller than the inner diameter of the cylindrical louver 21. The light-shielding piece 322 is a disk-shaped member having dimensions that allow the light-shielding piece 322 to be located within the light-shielding frame 321. The light-shielding frame 321 and the light-shielding piece 322 are disposed in the layout as illustrated in FIG. 13 on the upper surface of the ring stage 24 provided on the upper end of the cylindrical louver 21.

The rest of the configuration of the fourth preferred embodiment, excluding the shape of the light-shielding member 325, is the same as the configuration of the first preferred embodiment.

In the fourth preferred embodiment, when the semiconductor wafer W is preheated by the application of light from the halogen heating part 4, light emitted from the halogen lamps HL and passing through the clearance between the inner wall surface of the louver 21 and the outer periphery of the light-shielding frame 321 is applied to the peripheral portion of the semiconductor wafer W held by the holding part 7. On the other hand, part of the light emitted from the halogen lamps HL and travelling toward the region of the semiconductor wafer W that is located inward of the peripheral portion is blocked off by the light-shielding frame 321 and the light-shielding piece 322. This configuration allows the temperature distribution in the surface of the semiconductor wafer W to be uniform during preheating and consequently allows the temperature distribution in the surface of the semiconductor wafer W to be uniform during flash heating, as in the first preferred embodiment.

In particular, when preheating by the halogen heating part 4 is conducted with only the louver 21 installed, not only the overheat regions 99 having a shape as illustrated in FIG. 14 but also other overheat regions may also appear inward of the overheat regions 99 in the surface of the semiconductor wafer W. In this case, light travelling toward those overheat regions is separately blocked off by the light-shielding piece 322 provided in addition to the light-shielding frame 321 as in the fourth preferred embodiment. This configuration allows the temperature distribution in the surface of the semiconductor wafer W to be effectively uniform.

Fifth Preferred Embodiment

Next, a fifth preferred embodiment of the present invention will be described. FIG. 15 illustrates the layout of a louver 21 and a light-shielding member 25 according to the fifth preferred embodiment. In FIG. 15, constituent elements that are the same as the constituent elements of the first preferred embodiment are given the same reference numerals. While the light-shielding member 25 of the first preferred embodiment is located on the ring stage 24 provided on the louver 21, the light-shielding member 25 of the fifth preferred embodiment is located on the lower chamber window 64 of the chamber 6 that opposes the halogen heating part 4. The rest of the configuration of the fifth preferred embodiment, excluding the location of the light-shielding member 25, and the procedure of processing performed on the semiconductor wafer W are the same as the configuration and procedure of the first preferred embodiment.

As in the first preferred embodiment, the louver 21 is provided on the louver stage 22 such that its cylinder has a central axis that passes through the center of the semiconductor wafer W held by the holding part 7. The light-shielding member 25 is located on the lower chamber window 64 such that its annular shape has a central axis that passes through the center of the semiconductor wafer W held by the holding part 7. The materials and shapes of the louver 21 and the light-shielding member 25 are the same as the material and shape of the first preferred embodiment. Specifically, the louver 21 and the light-shielding member 25 are both made of a material (e.g., opaque quartz) that is impervious to the light emitted from the halogen lamps HL, and the outer diameter of the light-shielding member 25 is smaller than the inner diameter of the louver 21.

As illustrated in FIG. 15, light emitted from the halogen lamps HL and passing through the clearance between the inner wall surface of the louver 21 and the outer circumference of the light-shielding member 25 is applied to the peripheral portion of the semiconductor wafer W held by the holding part 7. This configuration relatively increases the intensity of illumination of the peripheral portion of the semiconductor wafer W with the light emitted from the halogen lamps HL, and thereby the peripheral portion where a temperature drop is likely to occur is strongly heated.

On the other hand, as in the first preferred embodiment, the light-shielding member 25 is present below the region of the semiconductor wafer W that is located slightly inward of the peripheral portion of the semiconductor wafer W held by the holding part 7. Thus, the light emitted from the halogen lamps HL and travelling toward the region of the semiconductor wafer W that is located slightly inward of the peripheral portion is blocked off by the light-shielding member 25 as illustrated in FIG. 15. This configuration relatively reduces the intensity of illumination of overheat regions 99 of semiconductor wafer W that may appear when only the louver 21 is installed, and thereby the overheat regions 99 are weakly heated.

In this way, the combination of the louver 21 and the light-shielding member 25 increases the intensity of illumination of the peripheral portion of the semiconductor wafer W with the light emitted from the halogen lamps HL, and at the same time, reduces the intensity of illumination of the region located slightly inward of the peripheral portion. As a result, the peripheral portion of the semiconductor wafer W where a temperature drop is likely to occur is relatively strongly heated, whereas the region located slightly inward of the peripheral portion and in which the temperature tends to increase with installation of only the louver 21 is relatively weakly heated. This configuration allows the temperature distribution in the surface of the semiconductor wafer W to be uniform during preheating.

Sixth Preferred Embodiment

Figure 16:
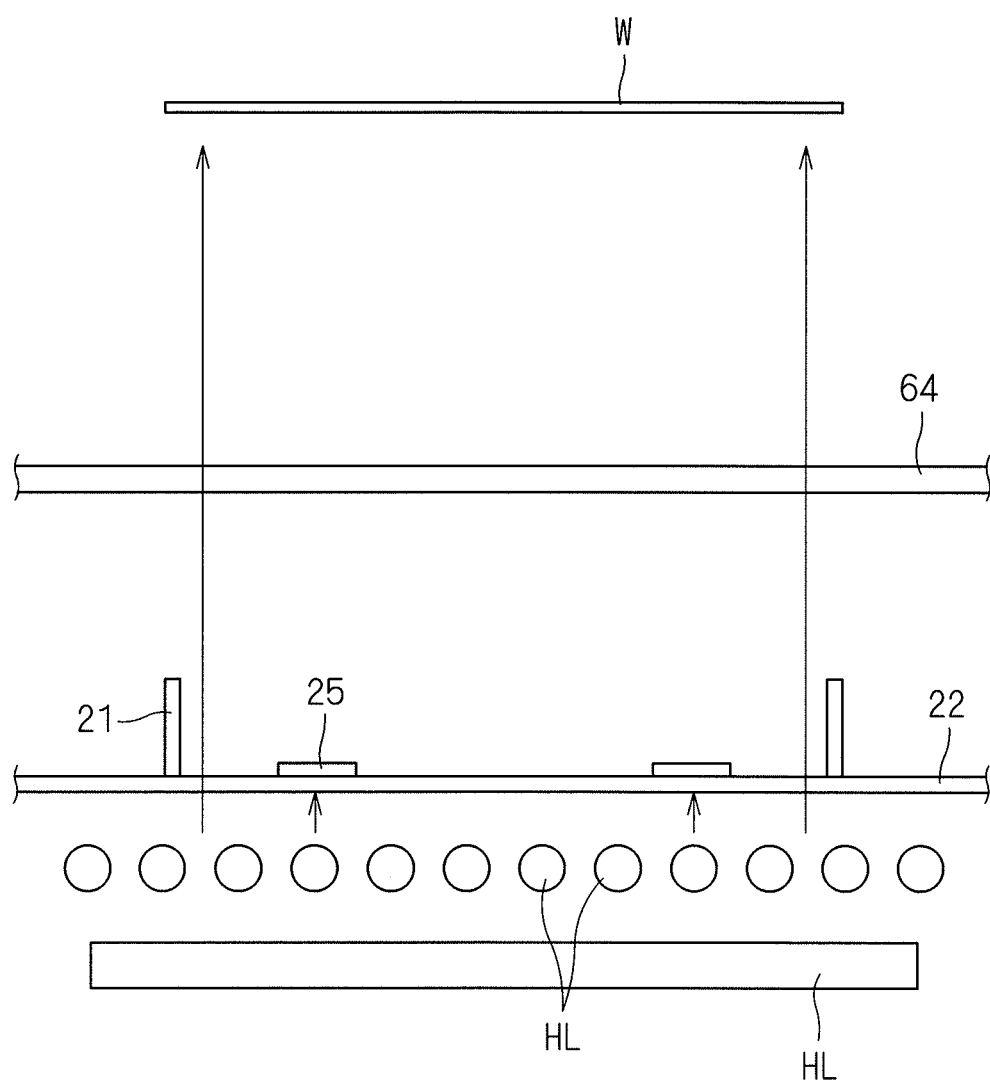
FIG. 16 illustrates the layout of a louver and a light-shielding member according to a sixth preferred embodiment.

Next, a sixth preferred embodiment of the present invention will be described. FIG. 16 illustrates the layout of a louver 21 and a light-shielding member 25 according to the sixth preferred embodiment. In FIG. 16, constitute elements that are the same as the constituent elements of the first preferred embodiment are given the same reference numerals. While the light-shielding member 25 of the first preferred embodiment is located on the ring stage 24 provided on the louver 21, the light-shielding member 25 of the sixth preferred embodiment is located on a louver stage 22 on which the louver 21 is also located. The rest of the configuration of the sixth preferred embodiment, excluding the location of the light-shielding member 25, and the procedure of processing performed on the semiconductor wafer W are the same as the configuration and procedure of the first preferred embodiment.

As in the first preferred embodiment, the louver 21 is also provided on the louver stage 22 such that its cylinder has a central axis that passes through the center of the semiconductor wafer W held by the holding part 7. The light-shielding member 25 is also provided on the louver stage 22 such that its annular shape has a central axis that passes through the center of the semiconductor wafer W held by the holding part 7. As illustrated in FIG. 16, the light-shielding member 25 is located inward of the cylindrical louver 21 on the louver stage 22 of quartz on which the louver 21 is located. The materials and shapes of the louver 21 and the light-shielding member 25 are the same as the material and shape of the first preferred embodiment. Specifically, the louver 21 and the light-shielding member 25 are both made of a material (e.g., opaque quartz) that is impervious to the light emitted from the halogen lamps HL, and the outer diameter of the light-shielding member 25 is smaller than the inner diameter of the louver 21.

As illustrated in FIG. 16, light emitted from the halogen lamps HL and passing through the clearance between the inner wall surface of the louver 21 and the outer circumference of the light-shielding member 25 is applied to the peripheral portion of the semiconductor wafer W held by the holding part 7. This configuration relatively increases the intensity of illumination of the peripheral portion of the semiconductor wafer W with the light emitted from the halogen lamps HL, and thereby the peripheral portion where a temperature drop is likely to occur is strongly heated.

On the other hand, the light-shielding member 25 is present below the region of the semiconductor wafer W that is located slightly inward of the peripheral portion of the semiconductor wafer W held by the holding part 7, as in the first preferred embodiment. Thus, light emitted from the halogen lamps HL and travelling toward the region of the semiconductor wafer W that is located slightly inward of the peripheral portion is blocked off by the light-shielding member 25 as illustrated in FIG. 16. This configuration relatively reduces the intensity of illumination of overheat regions 99 of the semiconductor wafer W that may appear when only the louver 21 is installed, and thereby the overheat regions 99 are weakly heated.

In this way, the combination of the louver 21 and the light-shielding member 25 increases the intensity of illumination of the peripheral portion of the semiconductor wafer W with the light emitted from the halogen lamps HL, and at the same time, reduces the intensity of illumination of the region located slightly inward of the peripheral portion. As a result, the peripheral portion of the semiconductor wafer W where a temperature drop is likely to occur is relatively strongly heated, whereas the region located slightly inward of the peripheral portion and in which the temperature tends to increase with installation of only the louver 21 is relatively weakly hated. This configuration allows the temperature distribution in the surface of the semiconductor wafer W to be uniform during preheating.

Seventh Preferred Embodiment

Next, a seventh preferred embodiment of the present invention will be described. FIG. 17 illustrates the layout of louvers 28 and 29 and a light-shielding member 25 according to the seventh preferred embodiment. In FIG. 17, constitute elements that are the same as the constituent elements of the first preferred embodiment are given the same reference numerals. While the light-shielding member 25 of the first preferred embodiment is located on the ring stage 24 provided on the louver 21, the light-shielding member 25 of the seventh preferred embodiment is located on the ring stage 24 that is sandwiched between the upper and lower louvers 28 and 29. The rest of the configuration of the seventh preferred embodiment, excluding the location of the light-shielding member 25, and the procedure of processing performed on the semiconductor wafer W are the same as the configuration and procedure of the first preferred embodiment.

In the seventh preferred embodiment, a louver is divided into upper and lower parts, i.e., the upper louver 29 and the lower louver 28. Like the louver 21 of the first preferred embodiment, the upper louver 29 and the lower louver 28 are both made of a material (e.g., opaque quartz) that is impervious to the light emitted from the halogen lamps HL. The outer diameters and inner diameters of the upper louver 29 and the lower louver 28 are respectively the same as the outer diameter and inner diameter of the louver 21 of the first preferred embodiment. Note that the heights of the upper louver 29 and the lower louver 28 may be set to an appropriate value.

The ring stage 24 is located to be sandwiched between the upper louver 29 and the lower louver 28. In other words, as in the first preferred embodiment, the ring stage 24 is located on the upper end of the cylindrical lower louver 28, and the cylindrical upper louver 29 made of the same material and having the same outer and inner diameters as the lower louver 28 is further located on the ring stage 24. Then, the light-shielding member 25 is located on the upper surface of the ring stage 24.

The upper louver 29 and the lower louver 28 are stacked on top of each other such that their cylinders have a central axis that passes through the center of the semiconductor wafer W held by the holding part 7. The light-shielding member 25 is also provided on the ring stage 24 such that its annular shape has a central axis that passes through the center of the semiconductor wafer W held by the holding part 7. The light-shielding member 25 is also made of a material (e.g., opaque quartz) that is impervious to the light emitted from the halogen lamps HL, and the outer diameter of the light-shielding member 25 is smaller than the inner diameters of the upper louver 29 and the lower louver 28.

As illustrated in FIG. 17, light emitted from the halogen lamps HL and passing through the clearance between the inner wall surfaces of the upper louver 29 and the lower louver 28 and the outer circumference of the light-shielding member 25 is applied to the peripheral portion of the semiconductor wafer W held by the holding part 7. This configuration relatively increases the intensity of illumination of the peripheral portion of the semiconductor wafer W with the light emitted from the halogen lamps HL, and thereby the peripheral portion where a temperature drop is likely to occur is strongly heated.

On the other hand, as in the first preferred embodiment, the light-shielding member 25 is present below the region of the semiconductor wafer W that is located slightly inward of the peripheral portion of the semiconductor wafer W held by the holding part 7. Thus, light emitted from the halogen lamps HL and travelling toward the region of the semiconductor wafer W located slightly inward of the peripheral portion is blocked off by the light-shielding member 25 as illustrated in FIG. 17. This configuration relatively reduces the intensity of illumination of overheat regions 99 of the semiconductor wafer W that may appear when only the louver 21 is installed, and thereby the overheat regions 99 are weakly heated.

In this way, the combination of the upper louver 29, the lower louver 28, and the light-shielding member 25 increases the intensity of illumination of the peripheral portion of the semiconductor wafer W with the light emitted from the halogen lamps HL, and at the same time, reduces the intensity of illumination of the region located slightly inward of the peripheral portion. As a result, the peripheral portion of the semiconductor wafer W where a temperature drop is likely to occur is relatively strongly heated, and the region located slightly inward of the peripheral portion and in which the temperature tends to increase with installation of only the louver 21 is relatively weakly heated. This configuration allows the temperature distribution in the surface of the semiconductor wafer W to be uniform during preheating.

Eighth Preferred Embodiment

Next, an eighth preferred embodiment of the present invention will be described. FIG. 18 is a longitudinal cross-sectional view of a configuration of a heat treatment apparatus 1a according to the eighth preferred embodiment. The heat treatment apparatus 1a of the eighth preferred embodiment is also a flash-lamp annealing apparatus for heating a disk-shaped semiconductor wafer W having a diameter of 300 mm as a substrate by irradiating the semiconductor wafer W with flash light. In FIG. 18, constituent elements that are the same as the constituent elements of the first preferred embodiment are given the same reference numerals. The eighth preferred embodiment is different from the first preferred embodiment in that two louvers, namely an outer louver 121 and an inner louver 123, are provided between the halogen heating part 4 and the chamber 6.

FIG. 19 is a perspective view of the outer louver 121 and the inner louver 123. The outer louver 121 and the inner louver 123 are both cylindrical (bottomless cylindrical) members having upper and lower opening ends. The outer louver 121 and the inner louver 123 are made of a material that is impervious to the light emitted from the halogen lamps HL of the halogen heating part 4, and for example, made of opaque quartz with a large number of superfine air bubbles contained in quartz glass.

As illustrated in FIG. 18, the louver stage 22 is provided on the upper end of the casing 41 of the halogen heating part 4. The louver stage 22 is a flat plate-like member made of quartz glass having transparency to the light emitted from the halogen lamps HL. The outer louver 121 and the inner louver 123 are located on the upper surface of this louver stage 22. That is, the outer louver 121 and the inner louver 123 are located below the lower chamber window 64 outside the chamber 6.

The outer louver 121 and the inner louver 123 are located such that their cylinders have a central axes CX that passes through the center of the semiconductor wafer W held by the holding part 7. That is, the outer louver 121 and the inner louver 123 are concentrically arranged on the louver stage 22 in a plan view. The halogen lamps HL of the halogen heating part 4 are arrayed in a region that opposes the lower surface of the semiconductor wafer W held by the holding part 7. Thus, the central axis CX of the outer louver 121 and the inner louver 123 also passes through the center of the array of the halogen lamps HL.

The diameter of the cylinder of the outer louver 121 is greater than the diameter of the semiconductor wafer W. In the present embodiment, for example, the outer louver 121 has an outer diameter of 323 mm and an inner diameter of 317 mm. That is, the diameter of the outer louver 121 at the central part of the plate thickness of the cylindrical wall is 320 mm.

On the other hand, the diameter of the cylinder of the inner louver 123 is smaller than the diameter of the semiconductor wafer W. In the present embodiment, for example, the inner louver 123 has an outer diameter of 283 mm and an inner diameter of 277 mm. That is, the diameter of the inner louver 123 at the central part of the plate thickness of the cylindrical wall is 280 mm.

In this way, the inner diameter of the outer louver 121 is greater than the outer diameter of the inner louver 123. Thus, the inner louver 123 is located inward of the outer louver 121 on the upper surface of the louver stage 22 as illustrated in FIG. 19. The outer louver 121 and the inner louver 123 have the same height of, for example, 15 to 25 mm (in the present embodiment, 23 mm).

With the inner louver 123 located inward of the outer louver 121, a cylindrical clearance is created between the inner wall surface of the outer louver 121 and the outer wall surface of the inner louver 123. The outer diameter of the cylindrical clearance (i.e., the inner diameter of the outer louver 121) is 317 mm, and the inner diameter of the clearance (i.e., the outer diameter of the inner louver 123) is 283 mm. That is, the interval of the cylindrical clearance between the inner wall surface of the outer louver 121 and the outer wall surface of the inner louver 123 is 17 mm, and the diameter from the center of the cylindrical clearance in the radial direction is 300 mm, which is the same as the diameter of the semiconductor wafer W. In other words, the center of the clearance between the inner wall surface of the outer louver 121 and the outer wall surface of the inner louver 123 is located immediately below the edge of the semiconductor wafer W held by the holding part 7, and the clearance opposes the peripheral portion of the semiconductor wafer W held by the holding part 7.

Figure 20:
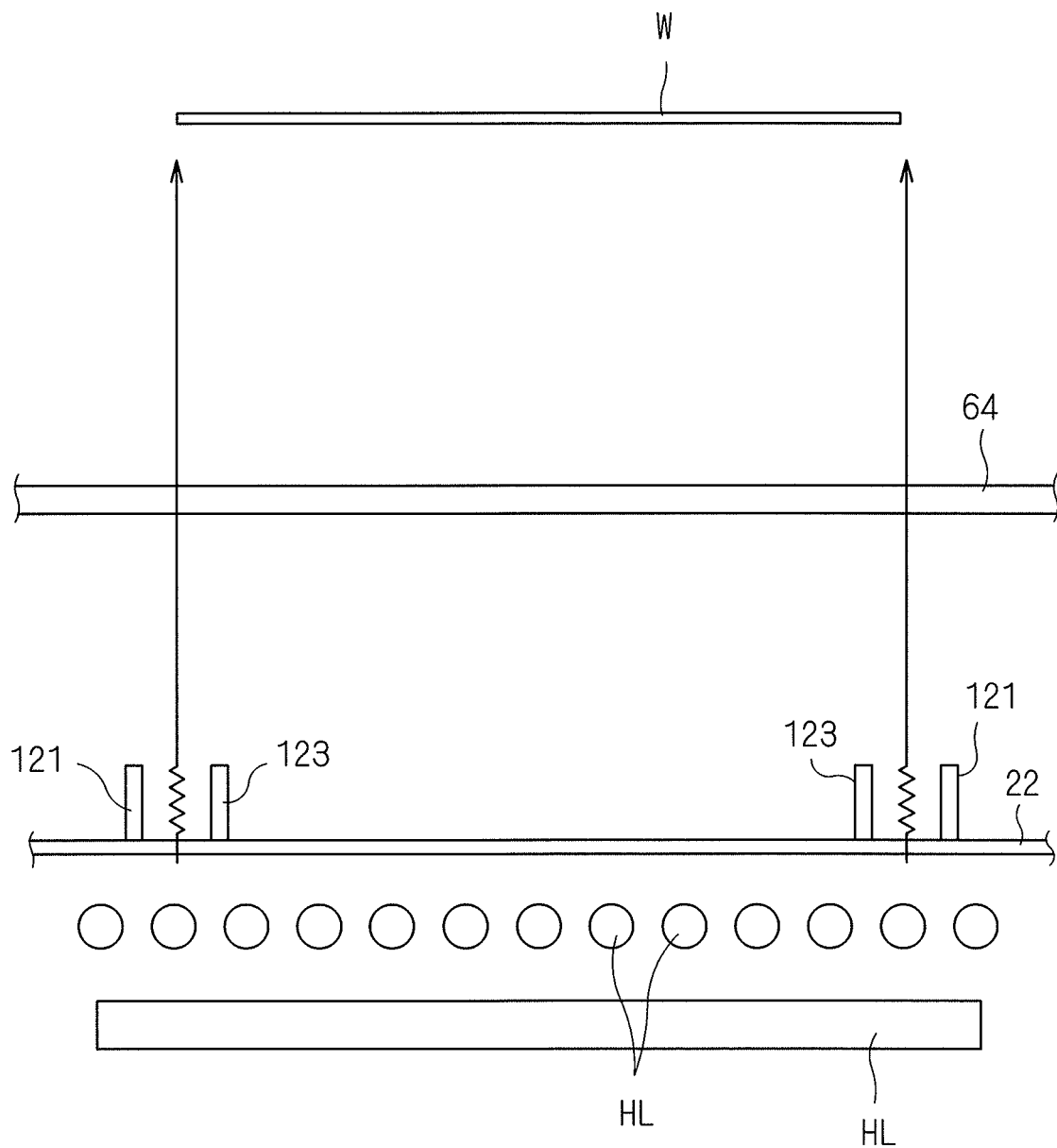
FIG. 20 illustrates how the optical path is controlled by the outer louver and the inner louver.

The procedure of processing performed on the semiconductor wafer W by the heat treatment apparatus 1a of the eighth preferred embodiment is the same as the procedure of the first preferred embodiment. In the eighth preferred embodiment, the opaque cylindrical outer and inner louvers 121 and 123 are provided between the halogen heating part 4 and the chamber 6 to control the optical path of light travelling from the halogen heating part 4 toward the semiconductor wafer W held by the holding part 7. FIG. 20 illustrates how the optical path is controlled by the outer louver 121 and the inner louver 123.

The outer louver 121 and the inner louver 123 are concentrically located on the louver stage 22 in a plan view, and the inner diameter of the outer louver 121 is greater than the outer diameter of the inner louver 123. Thus, a cylindrical clearance is present between the inner wall surface of the outer louver 121 and the outer wall surface of the inner louver 123 as illustrated in FIG. 20. As descried above, in the eighth preferred embodiment, the cylindrical clearance has an outer diameter of 317 mm, an inner diameter of 283 mm, and a height of 23 mm. The interval between the inner wall surface of the outer louver 121 and the outer wall surface of the inner louver 123 is 17 mm.

The cylindrical clearance between the inner wall surface of the outer louver 121 and the outer wall surface of the inner louver 123 is also located immediately below the peripheral portion of the semiconductor wafer W held by the holding part 7 in the chamber 6 and opposes the peripheral portion. Thus, light emitted from the halogen lamps HL of the halogen heating part 4 and entering the cylindrical clearance between the inner wall surface of the outer louver 121 and the outer wall surface of the inner louver 123 is repeatedly reflected by the inner wall surface of the outer louver 121 and the outer wall surface of the inner louver 123, which increases the upward directivity of the light, and reaches the peripheral portion of the semiconductor wafer W held by the holding part 7 as illustrated in FIG. 20. As a result, the intensity of illumination of the peripheral portion of the semiconductor wafer W becomes relatively higher than the intensity of illumination of the inner region of the semiconductor wafer W, and thereby the peripheral portion where a temperature drop is likely to occur is strongly heated with the halogen lamps HL during preheating.

It has also been found out that simply installing only a single louver above the halogen heating part 4 may, on the contrary, increase the temperature of the region of the semiconductor wafer W that is located slightly inward of the peripheral portion during heating with the light emitted from the halogen lamps HL. If a cylindrical clearance is formed by the outer louver 121 and the inner louver 123 as in the eighth preferred embodiment, the directivity of the light entering the clearance and travelling toward the peripheral portion of the semiconductor wafer W is increased. This reduces the possibility that the above light will reach the region located slightly inward of the peripheral portion and thereby prevents the region of the semiconductor wafer W located slightly inward of the peripheral portion from being strongly heated.

In this way, the cylindrical clearance between the outer louver 121 and the inner louver 123 increases the directivity of the light emitted from the halogen lamps HL and travelling toward the peripheral portion of the semiconductor wafer W and relatively increases the intensity of illumination of the peripheral portion. As a result, the peripheral portion of the semiconductor wafer W where a temperature drop is likely to occur is strongly heated. This configuration effectively resolves unevenness of the temperature distribution in the surface of the semiconductor wafer W during preheating.

The combination of the outer louver 121 and the inner louver 123 increases the directivity of the light travelling from the halogen heating part 4 toward the peripheral portion of the semiconductor wafer W and makes uniform the temperature distribution in the surface of the semiconductor wafer W at the preheating stage. It is thus also possible to make uniform the temperature distribution in the surface of the semiconductor wafer W during flash light irradiation.

In the eighth preferred embodiment, the opaque cylindrical outer and inner louvers 121 and 123 are provided between the halogen heating part 4 and the chamber 6 to increase the directivity of the light travelling from the halogen heating part 4 toward the peripheral portion of the semiconductor wafer W held by the holding part 7. During preheating by the halogen heating part 4, the temperature of the peripheral portion of the semiconductor wafer W tends to be lower than the temperature of the central portion, but it is possible to make uniform the temperature distribution in the surface of the semiconductor wafer W during preheating by increasing the directivity of the light travelling toward the peripheral portion and thereby relatively increasing the intensity of illumination. This consequently allows the temperature distribution in the surface of the semiconductor wafer W to be uniform during flash heating.

Variations

While the above has been a description of preferred embodiments of the present invention, various modifications other than the examples described above are possible without departing from the scope of the invention. For example, while the light-shielding members 25, 125, 225, and 325 of the above-described preferred embodiments are made of opaque quartz with a large number of superfine air bubbles contained in quartz glass, the material for the light-shielding members 25, 125, 225, and 325 is not limited to opaque quartz. For example, the light-shielding members 25, 125, 225, and 325 may be made of a material such as ceramic or metal that is impervious to the light emitted from the halogen lamps HL of the halogen heating part 4. The light-shielding members 25, 125, 225, and 325 do not necessarily have to be made of a completely opaque material (with 0% transmittance), and may be made of a material having 15% or less transmittance of the light emitted from the halogen lamps HL. It is of course preferable for the light-shielding member 25 to be made of opaque quartz that has no concern about pollution when the light-shielding member 25 is located within the chamber 6 as in the fifth preferred embodiment.

The louver 21 and the light-shielding members 25, 125, 225, and 325 may be made of different materials as long as those materials are impervious to the light emitted from the halogen lamps HL. In the third preferred embodiment, the light-shielding ring 221 and the light-shielding pieces 222 may be made of different materials. In this case, the light-shielding pieces 222 may have different transmittances of the light emitted from the halogen lamps HL. In the case where overheat regions appearing in the surface of the semiconductor wafer W have varying temperatures when preheating is conducted with installation of only the louver 21, it is preferable for the light-shielding pieces 222 to have different transmittance values depending on the temperatures in the overheat regions. More specifically, a light-shielding piece 222 that corresponds to an overheat region having a much higher temperature than the other region preferably has low transmittance (as close as 0% transmittance), whereas a light-shielding piece 222 that corresponds to an overheat region having a slightly higher temperature than the other region preferably has high transmittance. This configuration allows the intensity of illumination of the overheat regions to be controlled with higher accuracy and allows the temperature distribution in the surface of the semiconductor wafer W to be effectively uniform. In the third preferred embodiment, the light-shielding ring 221 and the light-shielding pieces 222 may of course have different transmittances.

Similarly, in the fourth preferred embodiment, the light-shielding frame 321 and the light-shielding piece 322 may be made of different materials. In this case, the light-shielding frame 321 and the light-shielding piece 322 may have different transmittances of the light emitted from the halogen lamps HL.

In the first to fourth preferred embodiments, the shape of the light-shielding member and the number of parts of the light-shielding member are not limited to the examples described above. For example, the light-shielding member may have, for example, an ellipsoidal shape, a star shape, or a polygonal shape other than the circular shape. While the number of parts of the light-shielding member is one in the first and second preferred embodiments and more than one in the third and fourth preferred embodiments, the light-shielding member may include an appropriate number of parts depending on the number of overheat regions that appear in the surface of the semiconductor wafer W when preheating is conducted with installation of only the louver 21. When the light-shielding member includes multiples parts, these parts of the light-shielding member may be arranged symmetrically or asymmetrically depending on the distribution of overheat regions in the surface of the semiconductor wafer W.

In short, in the first to fourth preferred embodiments, the light-shielding member may be provided in correspondence with overheat regions that have higher temperatures than the other region and appear in the surface of the semiconductor wafer W when preheating with the light emitted from the halogen heating part 4 is conducted with installation of only the louver 21. At this time, the number of parts of the light-shielding member, the shape of each part, and the transmittance of each part are preferably set in accordance with the form (number, shape, temperature) of appearance of overheat regions in the surface of the semiconductor wafer W.

In the first to fourth preferred embodiments, the height position at which the light-shielding member is located is not limited to a position on the upper surface of the ring stage 24 provided on the upper end of the louver 21, and may be a position between the halogen heating part 4 and the holding part 7 in the chamber 6. The distance from the halogen heating part 4 to the light-shielding member and the distance from the light-shielding member to the holding part 7 may preferably be within 20 cm.

In the fifth to seventh preferred embodiments, the shape of the light-shielding member 25 is not limited to an annular shape, and the outer periphery of the light-shielding member 25 may form a polygonal shape or an ellipsoidal shape. Even in this case, the light-shielding member 25 is an annular flat plate-like member. The outer dimensions of the annular light-shielding member 25 are smaller than the inner dimensions of the louver 21. Even with this light-shielding member 25, a clearance that allows the light emitted from the halogen lamps HL to transmit is created between the inner wall surface of the louver 21 and the outer periphery of the light-shielding member 25 as long as the outer dimensions of the light-shielding member 25 are smaller than the inner dimensions of the louver 21. Thus, similar effects to the effects of the fifth to seventh preferred embodiments are achieved.

While in the eighth preferred embodiment, the outer louver 121 and the inner louver 123 are made of opaque quartz with a large number of superfine air bubbles contained in quartz glass, the materials for the outer louver 121 and the inner louver 123 are not limited to opaque quartz. For example, the outer louver 121 and the inner louver 123 only need to be made of a material such as ceramic or metal that is impervious to the light emitted from the halogen lamps HL of the halogen heating part 4. When the outer louver 121 and the inner louver 123 are made of metal, stainless steel or aluminum is usable.

When the outer louver 121 and the inner louver 123 are made of a metal material, the inner wall surface of the outer louver 121 and the outer wall surface of the inner louver 123 may be mirror-polished. When the inner wall surface of the outer louver 121 and the outer wall surface of the inner louver 123 are mirror-finished surfaces, the reflectivities of the surfaces increase, and the light entering the cylindrical clearance between the inner wall surface of the outer louver 121 and the outer wall surface of the inner louver 123 is more effectively reflected and thereby has improved directivity.

While in the eighth preferred embodiment, the interval between the inner wall surface of the outer louver 121 and the outer wall surface of the inner louver 123 is 17 mm, the present invention is not limited to this example, and this interval may be greater than or equal to 10 mm and less than or equal to 30 mm. If the interval between the inner wall surface of the outer louver 121 and the outer wall surface of the inner louver 123 is less than 10 mm, the amount itself of the light entering the clearance between the outer louver 121 and the inner louver 123 decreases, and it is impossible, even by increasing the directivity of light, to sufficiently increase the intensity of illumination of the peripheral portion of the semiconductor wafer W. On the other hand, if the interval between the inner wall surface of the outer louver 121 and the outer wall surface of the inner louver 123 exceeds 30 mm, this increases the amount of light travelling toward the region of the semiconductor wafer W, which is located slightly inward of the peripheral portion, during heating with the light emitted from the halogen lamps HL and relatively increases the intensity of illumination of that region. In this case, uniformity of the temperature distribution may, on the contrary, be degraded. Thus, the interval between the inner wall surface of the outer louver 121 and the outer wall surface of the inner louver 123 is set to be greater than or equal to 10 mm and less than or equal to 30 mm.

While the two louvers, namely the outer louver 121 and the inner louver 123, are provided in the eighth preferred embodiment, the present invention is not limited to this example, and the number of louvers may be three or more. Such three or more louvers are all cylindrical members made of a material (e.g., opaque quartz) that is impervious to the light emitted from the halogen lamps HL. The three or more louvers are installed between the halogen heating part 4 and the holding part 7, specifically, on the upper surface of the louver stage 22 as in the eighth preferred embodiment.

The three or more louvers are installed such that their central axes pass through the center of the semiconductor wafer W held by the holding part 7, i.e., the louvers are concentrically arranged in a plan view. The louvers have different diameters and are sequentially arranged from outside to inside in descending order of their outer diameters. Also, the louvers have the same height. When three or more louvers are installed, there is a plurality of cylindrical clearances between the louvers. Thus, in the case where a region for which the intensity of illumination needs to be relatively increased by increasing the directivity of light emitted from the halogen heating part 4 is present in areas other than the peripheral portion of the semiconductor wafer W, three or more louvers are preferably provided to increase the intensities of illumination of a plurality of regions.

While in the above-described preferred embodiments, the flash heating part 5 includes 30 flash lamps FL, the present invention is not limited to this example, and the flash heating part 5 may include an arbitrary number of flash lamps FL. The flash lamps FL are not limited to xenon flash lamps, and may be krypton flash lamps. The number of halogen lamps HL included in the halogen heating part 4 is also not limited to 40, and the halogen heating part 4 may include an arbitrary number of halogen lamps HL as long as each of the upper and lower rows includes the array of a plurality of halogen lamps.

Also, substrates to be processed by the heat treatment apparatus of the present invention are not limited to semiconductor wafers, and may be glass substrates for use in a flat panel display such as a liquid crystal display device, or substrates for solar cells. The technique of the present invention is also applicable to other applications such as heat treatment of a high dielectric gate insulating film (high-k film), bonding of metal and silicon, and crystallization of polysilicon.

The application of the heat treatment technique of the present invention is not limited to flash lamp annealing apparatuses, and the technique is also applicable to other apparatuses such as a sheet-fed lamp annealing apparatus using halogen lamps, or apparatuses such as a CVD apparatus that use a heat source other than flash lamps. In particular, the technique of the present invention is preferably applicable to a backside annealing apparatus in which halogen lamps are located below a chamber and heat treatment is conducted with the light emitted from the rear surface of the semiconductor wafer.

While the invention has been shown and described in detail, the foregoing description is in all aspects illustrative and not restrictive. It is therefore to be understood that numerous modifications and variations can be devised without departing from the scope of the invention.

What is claimed is:

1. A heat treatment apparatus for heating a disk-shaped substrate by irradiating the substrate with light, comprising:
   a chamber that houses a substrate, wherein the substrate has a major surface and an area associated with said major surface;
   a holding part that holds a substrate in said chamber;
   a light irradiation part in which a plurality of rod-shaped lamps are arranged in a light source region that spans an area that is greater than the area of the major surface of the substrate held by said holding part and that opposes the major surface of the substrate;
   a cylindrical louver that is provided between said light irradiation part and said holding part, with a central axis of said louver passing through a center of said substrate, and that is impervious to the light being emitted from said light irradiation part, an outer diameter of said louver being equal to a diameter of the substrate, said louver being provided outside said chamber so as to be separated from said chamber, said louver blocking off a part of light travelling from said light irradiation part toward said substrate; and
   a light-shielding member provided between said light irradiation part and said holding part, which is impervious to the light emitted from said light irradiation part, said light-shielding member blocking light travelling from said light irradiation part toward overheated regions that form on said substrate when said louver is provided, said light-shielding member being provided inside an inner circumference of said louver, said light-shielding member being located to provide light blocking over the overheated regions, said light-shielding member including an annular light-shielding ring and a plurality of light-shielding pieces disposed inward of the annular light-shielding ring.

2. The heat treatment apparatus according to claim 1, wherein
   said plurality of rod-shaped lamps has a higher winding density in a peripheral portion of said light source region than in a central portion of said light source region.

3. The heat treatment apparatus according to claim 1, wherein
   said plurality of light-shielding pieces have different light transmitting characteristics.

* * * * *